US010170325B2

(12) United States Patent
Kim et al.

(10) Patent No.: US 10,170,325 B2
(45) Date of Patent: Jan. 1, 2019

(54) HARDMASK COMPOSITION AND METHOD OF FORMING PATTERN BY USING THE HARDMASK COMPOSITION

(71) Applicant: Samsung Electronics Co., Ltd., Suwon-si, Gyeonggi-do (KR)

(72) Inventors: Sangwon Kim, Seoul (KR); Hyeonjin Shin, Suwon-si (KR); Seongjun Park, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 15/332,287

(22) Filed: Oct. 24, 2016

(65) Prior Publication Data

US 2017/0040178 A1 Feb. 9, 2017

Related U.S. Application Data

(62) Division of application No. 14/725,390, filed on May 29, 2015, now Pat. No. 9,583,358.

(30) Foreign Application Priority Data

May 30, 2014 (KR) ........................ 10-2014-0066524
Aug. 29, 2014 (KR) ........................ 10-2014-0114530

(51) Int. Cl.
*H01L 21/02* (2006.01)
*H01L 21/308* (2006.01)
(Continued)

(52) U.S. Cl.
CPC ............ *H01L 21/3081* (2013.01); *C09D 1/00* (2013.01); *G03F 7/16* (2013.01); *G03F 7/168* (2013.01);
(Continued)

(58) Field of Classification Search
CPC ... C09D 1/00; G03F 7/16; G03F 7/168; G03F 7/2006; G03F 7/327; G03F 7/40;
(Continued)

(56) References Cited

U.S. PATENT DOCUMENTS 4,550,015 A 10/1985 Korb et al.
4,679,054 A 7/1987 Yoshikawa et al.
(Continued)

FOREIGN PATENT DOCUMENTS

CN 102774824 A 11/2012
CN 102775786 A 11/2012
(Continued)

OTHER PUBLICATIONS

European Search Report dated Sep. 30, 2015 issued in European Application No. 15169702.6.
(Continued)

*Primary Examiner* — Long K Tran
(74) *Attorney, Agent, or Firm* — Harness, Dickey & Pierce, P.L.C.

(57) ABSTRACT

A hardmask composition may include a solvent and a 2-dimensional carbon nanostructure containing about 0.01 atom % to about 40 atom % of oxygen or a 2-dimensional carbon nanostructure precursor thereof. A content of oxygen in the 2-dimensional carbon nanostructure precursor may be lower than about 0.01 atom % or greater than about 40 atom %. The hardmask composition may be used to form a fine pattern.

19 Claims, 15 Drawing Sheets

(51) Int. Cl.

| | |
|---|---|
| ***H01L 21/324*** | (2006.01) |
| ***H01L 21/311*** | (2006.01) |
| ***H01L 21/3213*** | (2006.01) |
| ***C09D 1/00*** | (2006.01) |
| ***G03F 7/16*** | (2006.01) |
| ***G03F 7/20*** | (2006.01) |
| ***G03F 7/32*** | (2006.01) |
| ***G03F 7/40*** | (2006.01) |

(52) U.S. Cl.
CPC ............ *G03F 7/2006* (2013.01); *G03F 7/327* (2013.01); *G03F 7/40* (2013.01); *H01L 21/02115* (2013.01); *H01L 21/3086* (2013.01); *H01L 21/31144* (2013.01); *H01L 21/324* (2013.01); *H01L 21/32139* (2013.01)

(58) Field of Classification Search
CPC ........... H01L 21/02115; H01L 21/3081; H01L 21/3086; H01L 21/31144; H01L 21/32139; H01L 21/324
See application file for complete search history.

(56) References Cited

U.S. PATENT DOCUMENTS

| | | | |
|---|---|---|---|
| 5,328,560 | A | 7/1994 | Hanawa et al. |
| 5,432,227 | A | 7/1995 | Fujimura |
| 6,031,756 | A | 2/2000 | Gimzewski et al. |
| 6,120,858 | A | 9/2000 | Hirano et al. |
| 7,803,715 | B1 | 9/2010 | Haimson et al. |
| 8,008,095 | B2 | 8/2011 | Assefa et al. |
| 8,071,486 | B2 | 12/2011 | Lee et al. |
| 8,258,346 | B2 | 9/2012 | Rajendran |
| 8,524,594 | B2 | 9/2013 | Horikoshi |
| 8,871,639 | B2 | 10/2014 | Chien et al. |
| 9,018,776 | B2 | 4/2015 | Song et al. |
| 9,562,169 | B2 | 2/2017 | Wang et al. |
| 9,583,358 | B2 | 2/2017 | Kim et al. |
| 9,666,602 | B2 | 5/2017 | Lee et al. |
| 2003/0203314 | A1 | 10/2003 | Sebald et al. |
| 2005/0112383 | A1 | 5/2005 | Tanaka et al. |
| 2005/0250052 | A1 | 11/2005 | Nguyen |
| 2007/0026682 | A1 | 2/2007 | Hochberg et al. |
| 2007/0148557 | A1 | 6/2007 | Takei et al. |
| 2008/0032176 | A1 | 2/2008 | Shimizu et al. |
| 2009/0011204 | A1 | 1/2009 | Wang et al. |
| 2009/0140350 | A1 | 6/2009 | Zhu |
| 2009/0297784 | A1 | 12/2009 | Xu et al. |
| 2010/0055464 | A1 | 3/2010 | Sung |
| 2010/0086463 | A1 | 4/2010 | Rudhard et al. |
| 2010/0218801 | A1 | 9/2010 | Sung et al. |
| 2010/0316950 | A1 | 12/2010 | Oguro et al. |
| 2011/0014111 | A1 | 1/2011 | Leugers et al. |
| 2011/0210282 | A1 | 9/2011 | Foley |
| 2012/0153511 | A1 | 6/2012 | Song et al. |
| 2012/0181507 | A1 | 7/2012 | Dimitrakopoulos et al. |
| 2012/0193610 | A1 | 8/2012 | Kim |
| 2013/0011630 | A1 | 1/2013 | Sullivan et al. |
| 2013/0119350 | A1 | 5/2013 | Dimitrakopoulos et al. |
| 2013/0133925 | A1 | 5/2013 | Kim et al. |
| 2013/0203198 | A1 | 8/2013 | Min et al. |
| 2013/0236715 | A1 | 9/2013 | Zhamu et al. |
| 2013/0313523 | A1 | 11/2013 | Yun et al. |
| 2014/0015000 | A1 | 1/2014 | Nishiyama et al. |
| 2014/0098458 | A1 | 4/2014 | Almadhoun et al. |
| 2014/0183701 | A1 | 7/2014 | Choi et al. |
| 2014/0186777 | A1 | 7/2014 | Lee et al. |
| 2014/0187035 | A1 | 7/2014 | Posseme et al. |
| 2014/0239462 | A1 | 8/2014 | Shamma et al. |
| 2014/0299841 | A1 | 10/2014 | Nourbakhsh et al. |
| 2014/0320959 | A1 | 10/2014 | Jun et al. |
| 2014/0342273 | A1 | 11/2014 | Kim et al. |
| 2015/0001178 | A1 | 1/2015 | Song et al. |
| 2015/0004531 | A1 | 1/2015 | Choi et al. |
| 2015/0008212 | A1 | 1/2015 | Choi et al. |
| 2015/0030968 | A1 | 1/2015 | Schwab et al. |
| 2015/0064904 | A1 | 3/2015 | Yao et al. |
| 2015/0129809 | A1 | 5/2015 | Gauthy et al. |
| 2015/0137077 | A1 | 5/2015 | Yun et al. |
| 2015/0200090 | A1 | 7/2015 | Chada et al. |
| 2015/0200091 | A1 | 7/2015 | Chada et al. |
| 2015/0348794 | A1 | 12/2015 | Kim et al. |
| 2015/0376014 | A1 | 12/2015 | Cesareo et al. |
| 2015/0377824 | A1 | 12/2015 | Ruhl et al. |
| 2016/0005625 | A1 | 1/2016 | Shin et al. |
| 2016/0011511 | A1 | 1/2016 | Shin et al. |
| 2016/0027645 | A1 | 1/2016 | Shin et al. |
| 2016/0043384 | A1 | 2/2016 | Zhamu et al. |
| 2016/0130151 | A1 | 5/2016 | Kurungot et al. |
| 2016/0152748 | A1 | 6/2016 | Goffredi et al. |
| 2016/0179005 | A1 | 6/2016 | Shamma et al. |
| 2016/0211142 | A1 | 7/2016 | Kim et al. |
| 2016/0225991 | A1 | 8/2016 | Schwab et al. |
| 2016/0240841 | A1 | 8/2016 | He et al. |
| 2016/0282721 | A1 | 9/2016 | Seol et al. |
| 2016/0284811 | A1 | 9/2016 | Yu et al. |
| 2016/0291472 | A1 | 10/2016 | Shin et al. |
| 2016/0346769 | A1 | 12/2016 | Kim et al. |
| 2016/0369149 | A1 | 12/2016 | Liu et al. |

FOREIGN PATENT DOCUMENTS

| | | | |
|---|---|---|---|
| EP | 1703328 | A1 | 9/2006 |
| EP | 2950334 | A1 | 12/2015 |
| JP | H 5-343308 | A | 12/1993 |
| JP | 3396846 | B2 | 4/2003 |
| JP | 2005-173552 | A | 6/2005 |
| JP | 4488234 | B2 | 4/2010 |
| JP | 4531400 | B2 | 6/2010 |
| JP | 2013-185155 | A | 9/2013 |
| JP | 2013208881 | A | 10/2013 |
| KR | 10-105218 | B1 | 8/2011 |
| KR | 101057218 | B1 | 8/2011 |
| KR | 10-2012-0024756 | A | 3/2012 |
| KR | 10-143171 | B1 | 7/2012 |
| KR | 101257694 | B1 | 4/2013 |
| KR | 2013-0132103 | A | 12/2013 |
| KR | 101343014 | B1 | 12/2013 |
| KR | 2014-0066524 | A | 6/2014 |
| KR | 101423171 | B1 | 7/2014 |
| KR | 10-1439030 | B1 | 9/2014 |
| KR | 2016-0118782 | A | 10/2016 |
| WO | WO-2013/100365 | A1 | 7/2013 |
| WO | WO-2014/135455 | A1 | 9/2014 |

OTHER PUBLICATIONS

Zhang, et al. "Fabrication of highly oriented reduced graphene oxide microbelts array for massive production of sensitive ammonia gas sensors", Journal of MicroMechanics and MicroEngineering, vol. 23, pp. 1-8, (2013).
Huang, et al. "An innovative way of etching MoS2: Characterization and mechanistic investigation", Nano Research, vol. 6, No. 3, pp. 200-207, (2013).
Hwang, et al. "Transparent actuator made with few layer graphene electrode and dielectric elastomer, for variable focus lens", Applied Physics Letters, vol. 103, pp. 023106-1-023106-5, (2013).
U.S. Office Action dated May 10, 2016 issued in co-pending U.S. Appl. No. 14/791,912.
U.S. Office Action dated Mar. 28, 2016 issued in co-pending U.S. Appl. No. 14/697,150.
"Silane Coupling Agents", Xiameter for Dow Corning, Silicones Simplified, pp. 1-7, (2009).
Grenadier, et al. "Dry etching techniques for active devices based on hexagonal boron nitride epilayers," Journal of Vacuum Science & Technology A, vol. 31, pp. 061517-061517.3 (2013).
S. Hascik, et al. "Dry etching of carbon layers in various etch gases," Vacuum, vol. 58, pp. 434-439 (2000).
Albert S. Nazarov, et al. "Functionalization and dispersion of h-BN nanosheets treated with inorganic reagents," Chemistry, An Asian Journal, vol. 7, Issue 3, pp. 1-6, (2012).

(56) References Cited

OTHER PUBLICATIONS

U.S. Office Action dated Aug. 16, 2016 issued in co-pending U.S. Appl. No. 14/791,912.
U.S. Office Action dated Sep. 30, 2016 issued in co-pending U.S. Appl. No. 14/697,150.
U.S. Notice of Allowance dated Oct. 19, 2016 issued in co-pending U.S. Appl. No. 14/725,390.
U.S. Appl. No. 14/697,150, filed Apr. 27, 2015.
U.S. Appl. No. 14/791,912, filed Jul. 6, 2015.
U.S. Appl. No. 14/725,390, filed May 29, 2015.
U.S. Office Action dated Feb. 8, 2017 issued in co-pending U.S. Appl. No. 14/791,912.
U.S. Notice of Allowance dated Mar. 15, 2017 issued in co-pending U.S. Appl. No. 14/697,150.
U.S. Office Action dated Jun. 13, 2017 issued in co-pending U.S. Appl. No. 14/791,912.
U.S. Office Action dated Oct. 6, 2017 issued in copending U.S. Appl. No. 14/843,003.
U.S. Notice of Allowance dated Aug. 28, 2017 issued in copending U.S. Appl. No. 14/791,912.
Extended European Search Report dated Aug. 17, 2016 issued in corresponding European Application No. 15193939.4.
Shin, et al. "Mass Production of Graphene Quantum Dots by One-Pot Synthesis Directly from Graphite in High Yield," Small-journal, vol. 10, No. 5, pp. 866-870 (2014).
Wang, et al. "Gram-scale synthesis of single-crystalline graphene quantum dots with superior optical properties," Nature Communications, pp. 1-9 (2014).
Song, et al. "High efficient Light-Emitting Diode of Graphene Quantum Dots Fabricated from Graphite Intercalation Compounds," Advanced Optical Materials, pp. 1-8 (2014).
U.S. Office Action dated Mar. 22, 2016 issued in copending U.S. Appl. No. 14/725,390.
U.S. Office Action dated Dec. 5, 2017 issued in co-pending U.S. Appl. No. 15/611,935.
U.S. Office Action dated Feb. 22, 2018 issued in co-pending U.S. Appl. No. 14/825,792.
U.S. Notice of Allowance dated Mar. 27, 2018 issued in co-pending U.S. Appl. No. 15/611,935.
U.S. Notice of Allowance dated Feb. 1, 2018 issued in co-pending U.S. Appl. No. 14/791,912.
U.S. Office Action dated May 22, 2018 issued in copending U.S. Appl. No. 14/843,003.
U.S. Appl. No. 15/611,935, filed Jun. 2, 2017.
U.S. Appl. No. 14/843,003, filed Sep. 2, 2015.
U.S. Appl. No. 14/825,792, filed Aug. 13, 2015.
U.S. Appl. No. 15/944,920, filed Apr. 4, 2018.
U.S. Notice of Allowance dated Jul. 16, 2018 issued in copending U.S. Appl. No. 14/825,792.
U.S. Notice of Allowance dated Jul. 20, 2018 issued in copending U.S. Appl. No. 15/611,935.
U.S. Office Action dated Aug. 10, 2018 issued in co-pending U.S. Appl. No. 14/791,912.

HARDMASK COMPOSITION AND METHOD OF FORMING PATTERN BY USING THE HARDMASK COMPOSITION

RELATED APPLICATION

This application is a divisional of U.S. application Ser. No. 14/725,390, filed on May 29, 2015, which claims priority under 35 U.S.C. § 119 to Korean Patent Application Nos. 10-2014-0066524, filed on May 30, 2014, and 10-2014-0114530, filed on Aug. 29, 2014, in the Korean Intellectual Property Office. The entire contents of each of the above-referenced applications are hereby incorporated by reference.

BACKGROUND

1. Field

The present disclosure relates to a hardmask composition, a method of manufacturing a hardmask composition, and/or a method of forming a pattern by using the hardmask composition.

2. Description of Related Art

The semiconductor industry has developed ultra-fine techniques for providing a pattern of several to several tens of nanometer size, which may benefit from effective lithographic techniques. A typical lithographic technique includes providing a material layer on a semiconductor substrate, coating a photoresist layer on the material layer, exposing and developing the same to provide a photoresist pattern, and etching the material layer by using the photoresist pattern as a mask.

As the size of the pattern to be formed becomes smaller, it may be difficult to provide a fine pattern having a desirable profile by only the typical lithographic technique described above. Accordingly, a layer, called "a hardmask", may be formed between the material layer for the etching and the photoresist layer to provide a fine pattern. The hardmask serves as an interlayer that transfers the fine pattern of the photoresist to the material layer through a selective etching process. Thus, it is desirable for the hardmask layer to have chemical resistance, thermal resistance, and etching resistance in order to tolerate various types of etching processes.

As semiconductor devices have become highly integrated, a height of a material layer has been maintained about the same or has relatively increased, although a line-width of the material layer has gradually narrowed. Thus, an aspect ratio of the material layer has increased. Since an etching process needs to be performed under such conditions, the heights of a photoresist layer and a hardmask pattern also need to be increased. However, increasing the heights of a photoresist layer and a hardmask pattern is limited. In addition, the hardmask pattern may be damaged during the etching process for obtaining a material layer with a narrow line-width, and thus electrical characteristics of devices may deteriorate.

In this regard, methods have been suggested to use a single layer or multiple layers, in which a plurality of layers are stacked, of a conductive or insulating material such as a polysilicon layer, a tungsten layer, and a nitride layer. However, the single layer or the multiple layers requires a high deposition temperature, and thus physical properties of the material layer may be modified. Therefore, a novel hardmask material is desired.

SUMMARY

Example embodiments relate to a hardmask composition with improved etching resistance.

Example embodiments relate also to a method of manufacturing a hardmask composition with improved etching resistance.

Example embodiments also relate a method of forming a pattern by using the hardmask composition.

Additional aspects will be set forth in part in the description which follows and, in part, will be apparent from the description, or may be learned by practice of example embodiments.

According to example embodiments, a hardmask composition includes a 2-dimensional carbon nanostructure containing about 0.01 atom % to about 40 atom % of oxygen or a 2-dimensional carbon nanostructure precursor thereof; and a solvent.

In example embodiments, a content of the oxygen in the 2-dimensional carbon nanostructure precursor may be lower than about 0.01 atom % and greater than or equal to about 0 atom %), or a content of the oxygen in the 2-dimensional carbon nanostructure precursor may be greater than about 40 atom %) and less than or equal to about 80 atom %.

In example embodiments, the 2-dimensional carbon nanostructure precursor may be one of expanded graphite obtained from exfoliated graphite and an oxidation product of acid-treated graphite.

In example embodiments, an intensity ratio of a D mode peak to a G mode peak obtained by Raman spectroscopy of the 2-dimensional carbon nanostructure may be 2 or lower (e.g., in a range of about 0.001 to about 2).

In example embodiments, an intensity ratio of a 2D mode peak to a G mode peak obtained by Raman spectroscopy of the 2-dimensional carbon nanostructure may be 0.01 or higher (e.g., in a range of about 0.01 to about 1.0).

In example embodiments, an intensity ratio of a D mode peak to a G mode peak obtained by Raman spectroscopy of the 2-dimensional carbon nanostructure precursor may be in a range of about 0.001 to about 2.

In example embodiments, an intensity ratio of a 2D mode peak to a G mode peak obtained by Raman spectroscopy of the 2-dimensional carbon nanostructure may be in a range of about 0.01 or higher.

In example embodiments, a diffraction angle 2θ of a (002) crystal face peak obtained by X-ray diffraction analysis of the 2-dimensional carbon nanostructure may be observed within a range of about 20° to about 27°.

In example embodiments, a d-spacing of the 2-dimensional carbon nanostructure obtained by X-ray diffraction analysis may be about 0.3 to about 0.5 nm.

In example embodiments, the 2-dimensional carbon nanostructure may have crystallinity in a C-axis, and an average particle diameter of crystals may be in a range from about 1 nm to about 100 nm.

In example embodiments, the solvent may include at least one of water, methanol, isopropanol, ethanol, N,N-dimethylformamide, N-methylpyrrolidone, dichloroethane, dichlorobenzene, N,N-dimethylsulfoxide, xylene, aniline, propylene glycol, propylene glycol diacetate, methoxy propanediol, diethylene glycol, gamma butyrolactone, acetyl acetone, cyclohexanone, propylene glycol monomethyl ether acetate, γ-butyrolactone, O-dichlorobenzene, nitromethane, tetrahydrofuran, dimethyl sulfoxide, nitrobenzene, butyl nitrite, methyl cellosolve, ethyl cellosolve, diethyl ether, diethylene glycol methyl ether, diethylene glycol ethyl ether, dipropylene glycol methyl ether, toluene, hexane, methyl ethyl ketone, methyl isobutyl ketone, hydroxymethyl cellulose, and heptane.

In example embodiments, a fraction of $sp^2$ carbon may be equal to or a multiple of a faction of $sp^3$ carbon in the 2-dimensional carbon nanostructure.

In example embodiments, the 2-dimensional carbon nanostructure may be included in the hardmask composition.

In example embodiments, a $sp^2$ carbon fraction may be greater than a $sp^3$ carbon fraction in the 2-dimensional carbon nanostructure.

In example embodiments, an intensity ratio ($I_D/I_G$) of a D mode peak to a G mode peak obtained by Raman spectroscopy of the 2-dimensional carbon nanostructure may be in a range from about 0.001 to about 2.0, and an intensity ratio ($I_{2D}/I_G$) of a 2D mode peak to a G mode peak obtained by Raman spectroscopy of the 2-dimensional carbon nanostructure may be in a range from about 0.01 to about 1.0.

In example embodiments, a d-spacing obtained from X-ray diffraction analysis of the 2-dimensional carbon nanostructure may be in a range from about 0.3 to about 0.7 nm.

In example embodiments, the 2-dimensional carbon nanostructure may have crystallinity in a C-axis. An average particle diameter of the crystals may be in a range of about 1.0 Å to about 1000 Å.

According to example embodiments, a method of forming a pattern includes forming a to-be-etched layer on a substrate; forming a hardmask on the to-be-etched layer by supplying the hardmask composition including a 2-dimensional carbon nanostructure containing about 0.01 atom % to about 40 atom % of oxygen; forming a photoresist pattern on the hardmask; forming a hardmask pattern on the to-be-etched layer by etching the 2-dimensional carbon nanostructure by using the photoresist pattern as an etching mask, the hardmask pattern including the 2-dimensional carbon nanostructure; and etching the to-be-etched layer by using the hardmask pattern as an etching mask.

In example embodiments, the forming the hardmask on the to-be-etched layer may include coating the hardmask composition on the to-be-etched layer.

In example embodiments, the method may further include heat-treating the hardmask composition, wherein the heat-treatment may be performed during or after the coating the hardmask composition on the to-be-etched layer.

In example embodiments, the forming the hardmask on the to-be-etched layer may include one of: coating the 2-dimensional carbon nanostructure precursor on the to-be-etched layer and then oxidizing or reducing the coated 2-dimensional carbon nanostructure precursor; oxidizing or reducing the 2-dimensional carbon nanostructure precursor into the 2-dimensional carbon nanostructure and then coating the 2-dimensional carbon nanostructure on the to-be-etched layer; and simultaneously coating and oxidizing or reducing the 2-dimensional carbon nanostructure precursor on the to-be-etched layer.

In example embodiments, the reducing may be performed by chemical reduction, heat-treatment reduction, or electrochemical reduction.

In example embodiments, the chemical reduction may be performed using at least one reducing agent. The at least one reducing agent may include one of ammonia-borane, hydrazine, sodium borohydride, dimethylhydrazine, sulfuric acid, hydrochloric acid, hydrogen iodide, hydrogen bromide, hydrogen sulfide, hydroquinone, hydrogen, and acetic acid.

In example embodiments, the heat-treatment may be performed at a temperature of about 100° C. to 1500° C.

In example embodiments, the oxidizing may be performed using at least one of an acid, an oxidizing agent, UV, ozone, IR, heat-treatment, and plasma.

In example embodiments, the 2-dimensional carbon nanostructure of the hardmask pattern may be a structure formed by stacking 2-dimensional nanocrystalline carbon layers.

In example embodiments, a thickness of the hardmask may be about 10 nm to about 10,000 nm.

In example embodiments, the step of forming the hardmask on the to-be-etched layer may be performed using at least one of spin coating, air spray, electrospray, dip coating, spray coating, a doctor blade method, and bar coating.

According to example embodiments, a method of making a hardmask composition includes preparing a 2-dimensional carbon nanostructure precursor; and forming a 2-dimensional carbon nanostructure by adjusting an oxygen content of the 2-dimensional carbon nanostructure precursor such that the 2-dimensional carbon nanostructure contains about 0.01 atom % to about 40 atom % of oxygen. A content of the oxygen in the 2-dimensional carbon nanostructure precursor may be lower than about 0.01 atom % and greater than or equal to about 0 atom %. Alternatively, a content of the oxygen in the 2-dimensional carbon nanostructure precursor may be greater than about 40 atom % and less than or equal to about 80 atom %.

In example embodiments, the preparing the 2-dimensional carbon nanostructure precursor may include exfoliating graphite.

In example embodiments, the preparing the 2-dimensional carbon nanostructure precursor may include heat-treating the 2-dimensional carbon nanostructure precursor.

In example embodiments, the forming the 2-dimensional carbon nanostructure may include at least one of oxidizing the 2-dimensional carbon nanostructure precursor and reducing the 2-dimensional carbon nanostructure precursor.

In example embodiments, the oxidizing the 2-dimensional carbon nanostructure precursor may include using at least one of an acid, an oxidizing agent, UV, ozone, IR, a heat-treatment process, and a plasma process.

In example embodiments, the reducing the 2-dimensional carbon nanostructure precursor may include at least one of chemical reduction, heat-treatment reduction, and electrochemical reduction.

In example embodiments, a method of forming a hardmask may include coating a solvent and the 2-dimensional carbon nanostructure precursor on a substrate, forming the 2-dimensional carbon nanostructure during or after the coating the solvent and the 2-dimensional carbon nanostructure precursor; baking the solvent and the 2-dimensional carbon nanostructure on the substrate after the forming the 2-dimensional carbon nanostructure; and performing a heat-treatment process on the 2-dimensional carbon nanostructure after the baking the solvent and the 2-dimensional carbon nanostructure.

In example embodiments, a method of forming a hardmask may include coating a solvent and the 2-dimensional carbon nanostructure on a substrate; baking the solvent and the 2-dimensional carbon nanostructure on the substrate; and performing a heat-treatment process on the 2-dimensional carbon nanostructure after the baking the solvent and the 2-dimensional carbon nanostructure.

BRIEF DESCRIPTION OF THE DRAWINGS

These and/or other aspects will become apparent and more readily appreciated from the following description of non-limiting embodiments, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
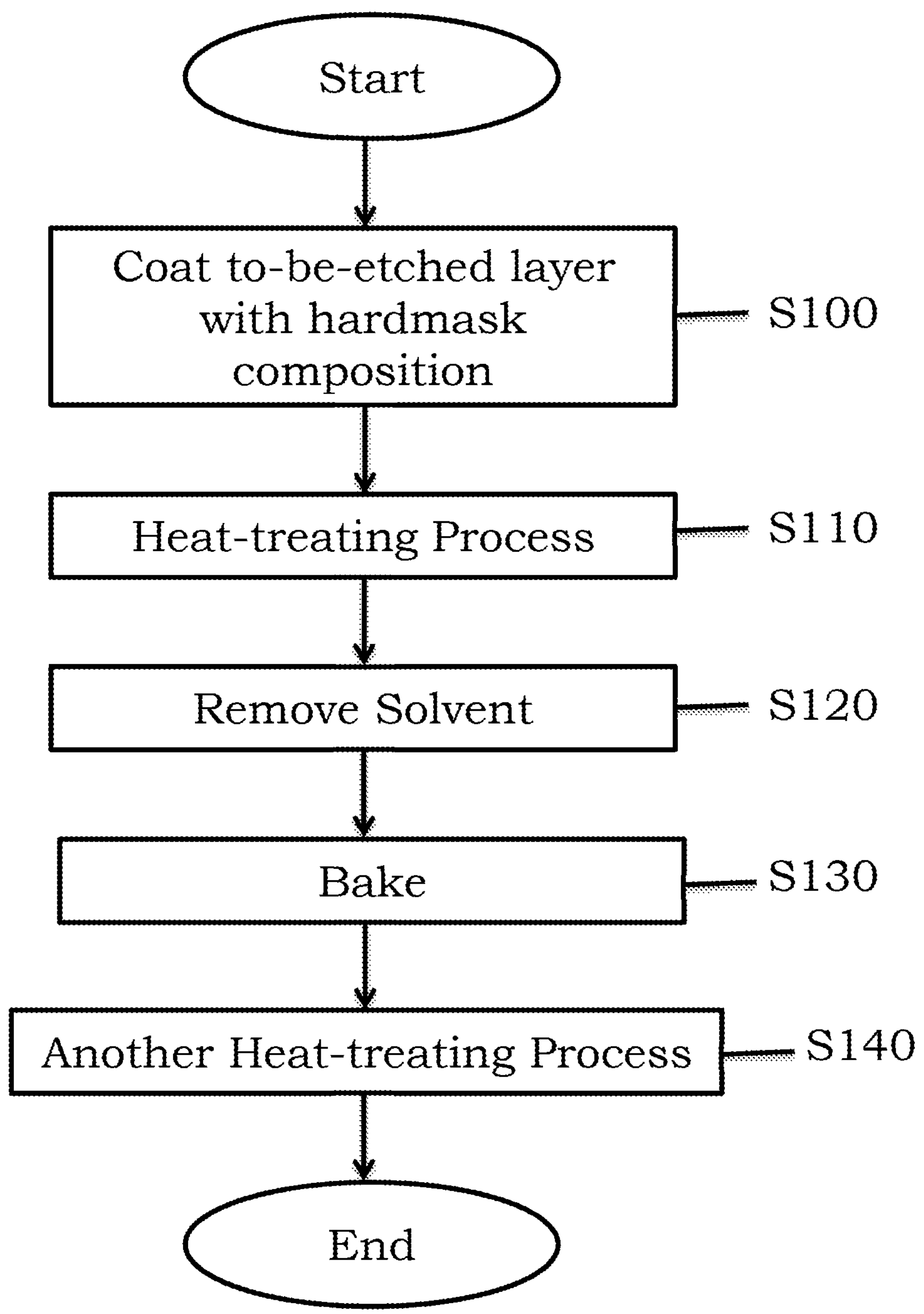
FIG. 1 illustrates a method of preparing a hardmask composition on a to-be-etched layer according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, hardmask compositions according to example embodiments and methods of forming a pattern by using the hardmask compositions will be described in detail.

According to example embodiments, a hardmask composition includes a 2-dimensional carbon nanostructure containing about 0.01 atom % to about 40 atom % of oxygen or a 2-dimensional carbon nanostructure precursor; and a solvent.

As used herein, the term "2-dimensional carbon nanostructure" refers to a sheet structure of a single atomic layer formed by a carbon structure that forms polycyclic aromatic molecules in which a plurality of carbon atoms are covalently bound to one another and aligned into a planar shape, a network structure in which a plurality of carbon structures each having a plate shape as a small film piece are interconnected and aligned into a planar shape, or a combination thereof. The covalently bound carbon atoms form repeating units that comprise 6-membered rings but may also form 5-membered rings and/or 7-membered rings. The carbon structure may be formed by stacking a plurality of layers including several sheet structures and/or network structures, and an average thickness of the carbon structure may be about 100 nm or less, for example, about 10 nm or less, or in a range of about 0.01 nm to about 10 nm. A thickness of the carbon structure may be in a range of about 0.01 nm to about 100 nm.

The 2-dimensional carbon nanostructure according to example embodiments may include oxygen atoms in addition to carbon atoms rather than being a complete C=C/C—C conjugated structure. Also, the 2-dimensional carbon nanostructure may have a carboxyl group, a hydroxy group, an epoxy group, or a carbonyl group at its end.

An oxygen content of the 2-dimensional carbon nanostructure may be, for example, in a range of about 6.5 atom % to about 19.9 atom %, for example, about 10.33 atom % to about 14.28 atom %. In the 2-dimensional carbon nanostructure, the oxygen content may be confirmed by, for example, an XPS analysis.

When an oxygen content is 0.01 atom % or less in the 2-dimensional carbon nanostructure, the etching resistance of a hardmask formed by using a hardmask composition including the 2-dimensional carbon nanostructure may deteriorate, and when an oxygen content is 40 atom % or higher, degassing may occur during an etching process.

In example embodiments, the 2-dimensional carbon nanostructure may have an oxygen content within the ranges described above (e.g., containing about 0.01 atom % to about 40 atom % of oxygen, containing about 6.5 atom % to about 19.9 atom % of oxygen, and/or containing about 10.33 atom % to about 14.28 atom % of oxygen), and thus may have hydrophilic property so that a bonding strength to another layer may be improved. Also, a dispersing property of the 2-dimensional carbon nanostructure in a solvent may improve, and thus the hardmask composition may be more easily prepared. In addition, due to the high bond-dissociation energy of a functional group including an oxygen atom, etching resistance to an etching gas may improve.

In example embodiments, the 2-dimensional carbon nanostructure may have peaks observed at about 1340 $cm^{-1}$ to about 1350 $cm^{-1}$, about 1580 $cm^{-1}$, and about 2700 $cm^{-1}$ in Raman spectrum analysis. The peaks provide information related to a thickness, a crystallinity, and a charge doping status of the 2-dimensional carbon nanostructure. The peak observed at about 1580 $cm^{-1}$ is a "G mode" peak, which is generated by a vibration mode corresponding to stretching of a carbon-carbon bond. Energy of the "G mode" is determined by a density of excess charge doped in the 2-dimensional carbon nanostructure. Also, the peak observed at about 2700 $cm^{-1}$ is a "2D mode" peak that is useful in the evaluation of a thickness of the 2-dimensional carbon nanostructure. The peak observed at about 1340 $cm^{-1}$ to about 1350 $cm^{-1}$ was a "D mode" peak, which appears when an $sp^2$ crystal structure has defects and is mainly observed when many defects are found around edges of a sample or in the sample itself. Also, a ratio of a D peak intensity to a G peak intensity (an D/G intensity ratio) provides information of a degree of disorder of crystals of the 2-dimensional carbon nanostructure.

In example embodiments, an intensity ratio ($I_D/I_G$) of a D mode peak to a G mode peak obtained from Raman spectroscopy analysis of the 2-dimensional carbon nanostructure may be 2 or lower. For example, the intensity ratio ($I_D/I_G$) may be within a range of about 0.001 to about 2.0. An intensity ratio ($I_D/I_G$) of a D mode peak to a G mode peak obtained from Raman spectroscopy analysis of the 2-dimensional carbon nanostructure precursor may be 2 or lower. For example, in example embodiments, the intensity ratio ($I_D/I_G$) may be within a range of about 0.001 to about 2.0. For example, in example embodiments, the intensity ratio ($I_D/I_G$) may be within a range of about 0.001 to about 1.0.

In example embodiments, an intensity ratio ($I_{2D}/I_G$) of a 2D mode peak to a G mode peak obtained from Raman spectroscopy analysis of the 2-dimensional carbon nanostructure may be 0.01 or higher. For example, the intensity ratio ($I_{2D}/I_G$) may be within a range of about 0.01 to about 1.0, or about 0.05 to about 0.5.

In example embodiments, an intensity ratio ($I_{2D}/I_G$) of a 2D mode peak to a G mode peak obtained from Raman spectroscopy analysis of the 2-dimensional carbon nanostructure precursor may be 0.01 or higher. For example, the intensity ratio ($I_{2D}/I_G$) may be within a range of about 0.01 to about 1.0, or about 0.05 to about 0.5.

When the intensity ratio of a D mode peak to a G mode peak and the intensity ratio of a 2D mode peak to a G mode peak are within the ranges above, the 2-dimensional carbon nanostructure may have a high crystallinity and a small defect density; consequently, a bonding energy increases so that a hardmask prepared by using the 2-dimensional carbon nanostructure may have excellent etching resistance.

X-ray diffraction analysis using CuKα is performed on the 2-dimensional carbon nanostructure, and as the result of the X-ray analysis, the 2-dimensional carbon nanostructure may include a 2-dimensional layered structure having a (002) crystal face peak. The (002) crystal face peak may be observed within a range of about 20° to about 27°.

In example embodiments, a d-spacing of the 2-dimensional carbon nanostructure obtained from the X-ray diffraction analysis may be in the range of about 0.3 to about 0.7, for example, about 0.334 to about 0.478. In addition, an average particle diameter of the crystals obtained from the X-ray diffraction analysis may be about 1 nm or greater, or for example, in a range of about 23.7 Å to about 43.9 Å. When the d-spacing is within the range, the hardmask composition may have excellent etching resistance.

The 2-dimensional carbon nanostructure is formed as a single layer of 2-dimensional nanocrystalline carbon or it is formed by stacking multiple layers of 2-dimensional nanocrystalline carbon.

The 2-dimensional carbon nanostructure according to example embodiments has a higher content of sp2 carbon than that of $sp^3$ carbon and a higher content of oxygen compared to a conventional amorphous carbon layer. An $sp^2$ carbon bond (that is, a bond of an aromatic structure) has a higher bonding energy than that of an $sp^3$ carbon bond.

The $sp^3$ structure is a 3-dimensional bonding structure of diamond having a tetrahedral shape, and the $sp^2$ structure is a 2-dimensional bonding structure of graphite in which a carbon to hydrogen ratio (a C/H ratio) increases and thus may secure resistance to dry etching.

In the 2-dimensional carbon nanostructure, an $sp^2$ carbon fraction is equal to or a multiple of an $sp^3$ carbon fraction. For example, an $sp^2$ carbon fraction is a multiple of an $sp^3$ carbon fraction by about 1.0 to about 10, or by about 1.88 to 3.42.

An amount of the $sp^2$ carbon atom bonding structure is about 30 atom % or more, for example, about 39.7 atom % to about 62.5 atom %, in the C1s XPS analysis. Due to the mixing ratio, bond breakage of the 2-dimensional carbon nanostructure may be difficult since carbon-carbon bond energy is high. Thus, when a hardmask composition including the 2-dimensional carbon nanostructure is used, etching resistance characteristics during the etching process may improve. Also, a bond strength between the hardmask and adjacent layers may increase.

A hardmask obtained by using conventional amorphous carbon mainly includes a $sp^2$-centered carbon atom binding structure and thus may have excellent etching resistance and low transparency. Therefore, when the hardmasks are aligned, problems may occur, and particles may be generated during a deposition process, and thus a hardmask manufactured by using a diamond-like carbon having a $sp^3$-carbon atom binding structure has been developed. However, the hardmask has low etching resistance and thus has a limit in process application.

In example embodiments, a 2-dimensional carbon nanostructure may have good transparency and excellent etching resistance.

In example embodiments, a 2-dimensional carbon nanostructure may have crystallinity in a C-axis (a vertical direction of the layer) and an average particle diameter of about 1 nm or higher as in the result of XRD analysis and/or about 1.0 Å or higher as in the result of XRD analysis. An average particle diameter of the crystals may be, for example, in a range of about 1.0 Å to about 1000 Å, or about 23.7 Å to about 43.9 Å. When an average particle diameter of the crystals is within this range, the hardmask may have excellent etching resistance.

In hardmask compositions according to example embodiments, any solvent capable of dispersing the 2-dimensional carbon nanostructure or the 2-dimensional carbon nanostructure precursor may be used. For example, the solvent may be at least one selected from water, an alcohol-based solvent, and an organic solvent.

Examples of the alcohol-based solvent may include methanol, ethanol, and isopropanol, and examples of the organic solvent may include N,N-dimethylformamide, N-methylpyrrolidone, dichloroethane, dichlorobenzene, dimethylsulfoxide, xylene, aniline, propylene glycol, propylene glycol diacetate, methoxypropanediol, diethyleneglycol, acetylacetone, cyclohexanone, propylene glycol monomethyl ether acetate, γ-butyrolactone, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, xylene, hexane, methylethylketone, isobutyl ketone, hydroxymethylcellulose, and heptane.

An amount of the solvent may be about 100 parts to about 100,000 parts by weight based on 100 parts by weight of the 2-dimensional carbon nanostructure or the 2-dimensional carbon nanostructure precursor. When an amount of the solvent is within this range, the hardmask composition may have an appropriate viscosity and thus may easily form a layer.

The 2-dimensional carbon nanostructure precursor may be, for example, i) expanded graphite obtained from exfoliated graphite or ii) an oxidation product of acid-treated graphite.

Hereinafter, a method of preparing a hardmask by using a hardmask composition according to example embodiments will be described in detail.

FIG. 1 illustrates a method of preparing a hardmask composition on a to-be-etched layer according to example embodiments.

In example embodiments, the hardmask composition may include a 2-dimensional carbon nanostructure containing about 0.01 atom % to about 40 atom % of oxygen or a 2-dimensional carbon nanostructure precursor thereof and a solvent.

First, preparation of the hardmask composition including the 2-dimensional carbon nanostructure containing about 0.01 atom % to about 40 atom % of oxygen will be described.

Referring to FIG. 1, in operation S100, a to-be-etched layer may be coated with the hardmask composition that includes the 2-dimensional carbon nanostructure containing about 0.01 atom % to about 40 atom % of oxygen and a solvent to prepare a hardmask including the 2-dimensional carbon nanostructure containing about 0.01 atom % to about 40 atom % of oxygen.

In operation S110, a heat-treating process may be performed during or after coating the to-be-etched layer with the hardmask composition. Conditions for the heat-treating process may vary depending on a material of the to-be-etched layer, but a temperature of the heat-treating process may be from room temperature (in a range of about 20° C. to about 25° C.) to about 1500° C.

The heat-treating process may be performed in an inert gas atmosphere and/or in vacuum.

A heating source of the heat-treating process may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat-treating process, in operation S120, the solvent may be removed. In operation S130, the resultant from which the solvent is removed may be baked at a temperature of about 100° C. to about 400° C. Then, in operation S140, another heat-treating process may be performed on the baked resultant at a temperature of about 400° C. to about 1,000° C.

When the temperatures of the heat-treating process and the baking process are within these ranges above, hardmasks with excellent etching resistance may be prepared.

A temperature increasing rate in the heat-treating process and the baking process may be about 1° C./min to about 1000° C./min. When a temperature increasing rate is within this range, the deposited layer may not be damaged due to a rapid temperature change, and thus a process efficiency may be excellent.

Next, preparation of the hardmask composition including the precursor of the 2-dimensional carbon nanostructure will be described. The 2-dimensional carbon nanostructure precursor may be i) a 2-dimensional carbon nanostructure having less than 0.01 atom % of oxygen or ii) an oxygen free 2-dimensional carbon nanostructure.

In example embodiments, the 2-dimensional carbon nanostructure precursor may be, for example, expanded graphite obtained from exfoliated graphite. When expanded graphite is used as the 2-dimensional carbon nanostructure precursor, self-agglomeration of carbon layers constituting the 2-dimensional carbon nanostructure is suppressed, and thus the 2-dimensional carbon nanostructure may be evenly dispersed in the hardmask composition without adding an additive such as a dispersing agent or a surfactant so that the hardmask thus prepared may have excellent etching resistance, and a process for removing unnecessary hardmask patterns after forming a to-be-etched layer pattern may be easy, where a residue such as a carbon residue may not be produced in the process.

In example embodiments, a 2-dimensional carbon nanostructure precursor may have a structure that is formed of carbon layers obtained by performing a liquid exfoliating process using a solvent on expanded graphite.

The carbon layers may include different number of layers, for example, one layer to three hundred layers. For example, the carbon layers may include one layer to sixty layers, one layer to fifteen layers, or one layer to ten layers.

Figure 2:
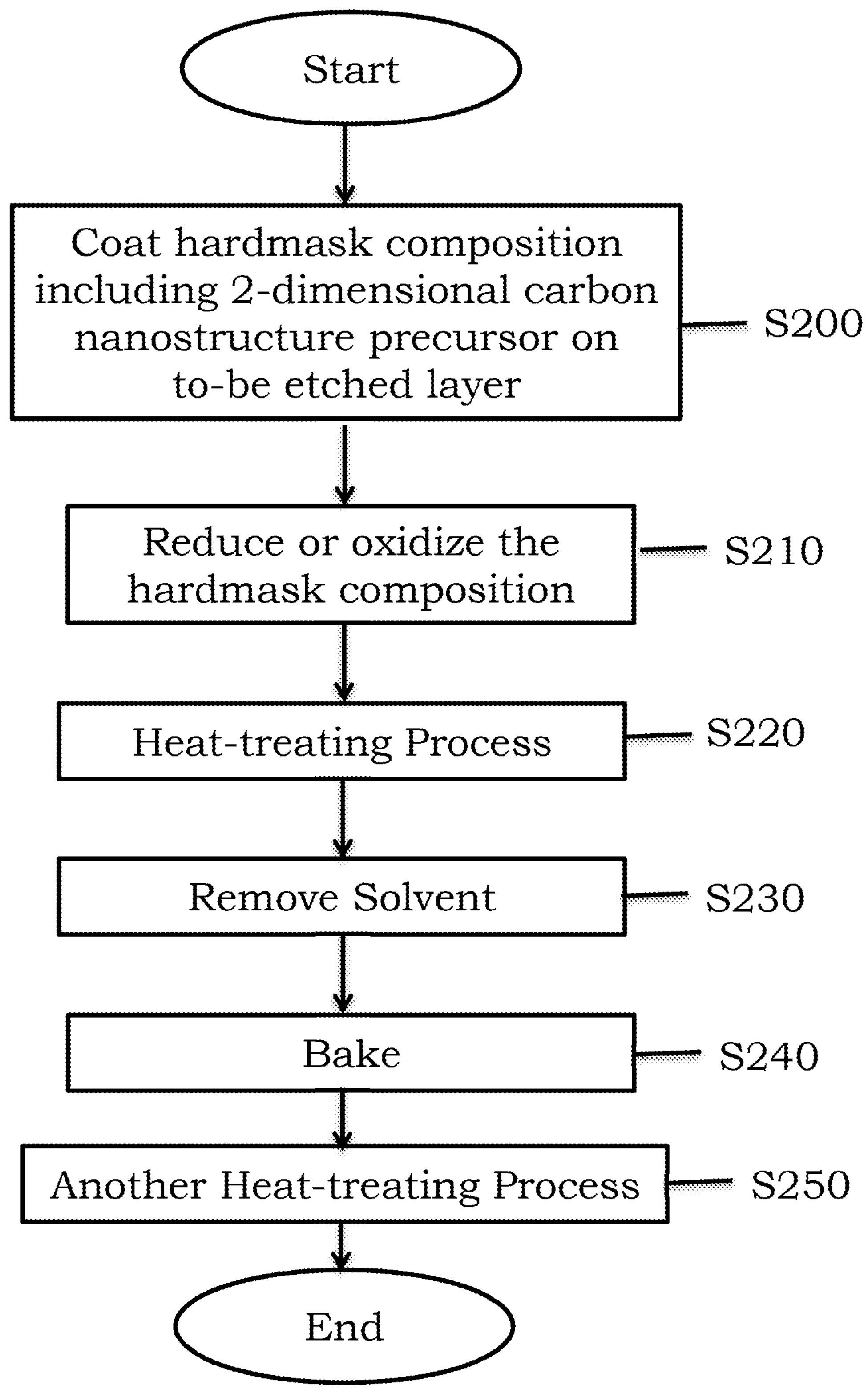
FIG. 2 illustrates a method of preparing a hardmask composition on a to-be-etched layer according to example embodiments.

FIG. 2 illustrates a method of preparing a hardmask composition on a to-be-etched layer according to example embodiments.

Referring to FIG. 2, in operations S200 and S210, a hardmask according to example embodiments may be prepared by coating the to-be-etched layer with the hardmask composition including the 2-dimensional carbon nanostructure precursor and a solvent (S200) and then oxidizing or reducing the coated product (S210).

The oxidizing or reducing the coated product may be controlled until the coated product is transformed to a hardmask including the 2-dimensional carbon nanostructure containing a desired oxygen content (e.g., about 0.01 atom % to about 40 atom % of oxygen).

In operation S220, a heat-treating process may be performed after oxidizing or reducing the coated product. Conditions for the heat-treating process may vary depending on a material of the to-be-etched layer, but a temperature of the heat-treating process may be from room temperature (in a range of about 20° C. to about 25° C.) to about 1500° C. The heat-treating process may be performed in an inert gas atmosphere and/or in vacuum. A heating source of the heat-treating process may be induction heating, radiant heat, lasers, infrared rays, microwaves, plasma, ultraviolet rays, or surface plasmon heating. The inert gas atmosphere may be prepared by mixing a nitrogen gas and/or an argon gas.

After the heat-treating process, in operation S230, the solvent may be removed. In operation S240, the resultant from which the solvent is removed may be baked at a temperature of about 100° C. to about 400° C. Then, in operation S250, another heat-treating process may be performed on the baked resultant at a temperature of about 400° C. to about 1,000° C.

When the temperatures of the heat-treating process and the baking process are within these ranges above, hardmasks with excellent etching resistance may be prepared. A temperature increasing rate in the heat-treating process and the baking process may be about 1° C./min to about 1000° C./min. When a temperature increasing rate is within this range, the deposited layer may not be damaged due to a rapid temperature change, and thus a process efficiency may be excellent.

Figure 3:
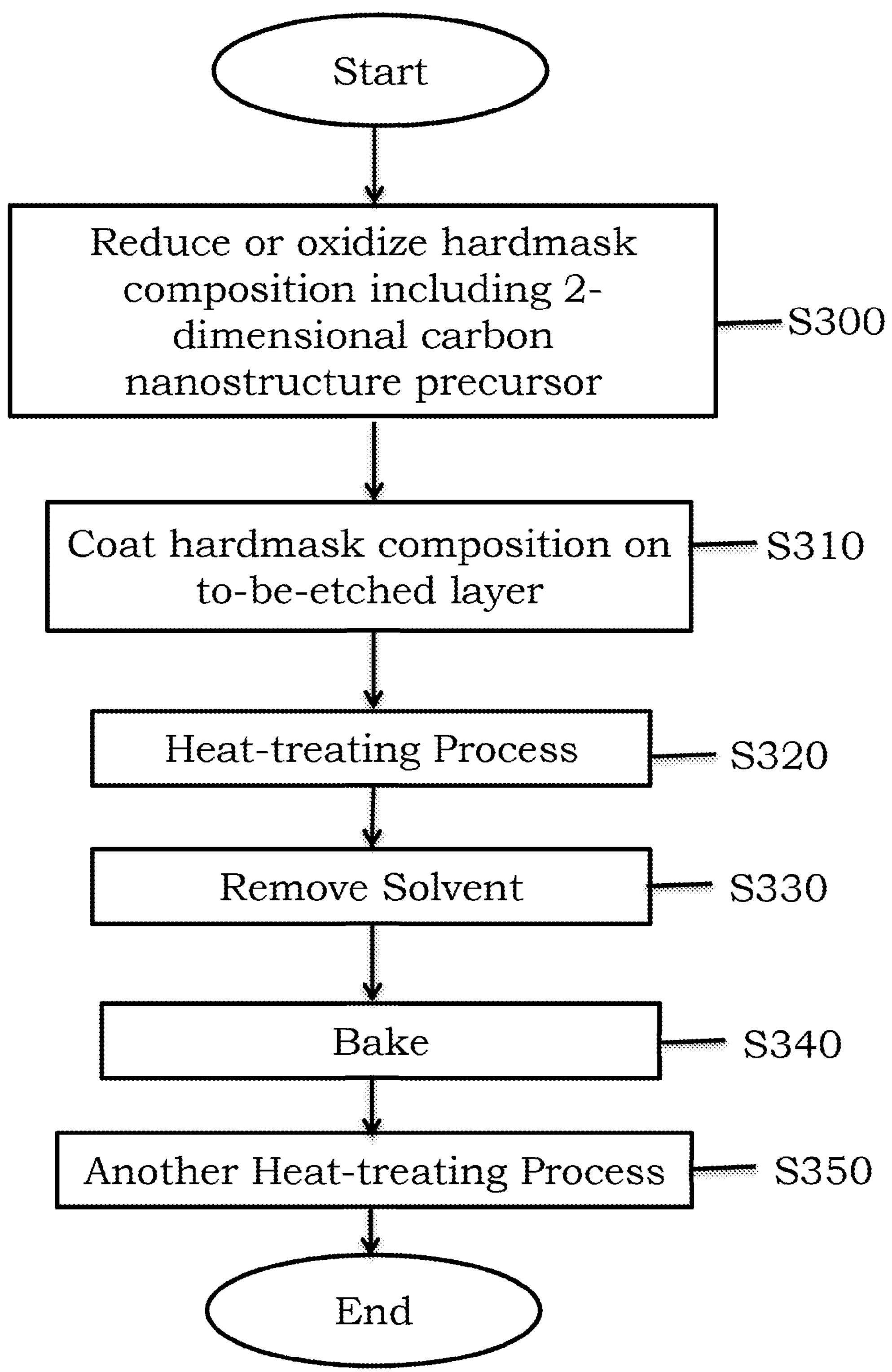
FIG. 3 illustrates a method of preparing a hardmask composition on a to-be-etched layer according to example embodiments.

FIG. 3 illustrates a method of preparing a hardmask composition on a to-be-etched layer according to example embodiments.

Referring to FIG. 3, in operations S300 and S310, a hardmask according to example embodiments may be prepared by oxidizing or reducing the hardmask composition including the 2-dimensional carbon nanostructure precursor and a solvent (S300) and then coating the to-be-etched layer with the oxidized or reduced product (S310). The oxidizing or reducing the coated product may be controlled until the hardmask including the 2-dimensional carbon nanostructure precursor is transformed to a hardmask including the 2-dimensional carbon nanostructure containing a desired oxygen content (e.g., about 0.01 atom % to about 40 atom % of oxygen).

In operation S320, a heat-treating process may be performed after coating the hardmask composition on the to-be-etched layer. Conditions for the heat-treating process may vary depending on a material of the to-be-etched layer, but a temperature of the heat-treating process may be from room temperature (in a range of about 20° C. to about 25° C.) to about 1500° C. The heat-treating process may be performed in an inert gas atmosphere and/or in vacuum. A heating source of the heat-treating process may be induction heating, radiant heat, lasers, infrared rays, microwaves, plasma, ultraviolet rays, or surface plasmon heating. The inert gas atmosphere may be prepared by mixing a nitrogen gas and/or an argon gas.

After the heat-treating process, in operation S330, the solvent may be removed. In operation S340, the resultant from which the solvent is removed may be baked at a temperature of about 100° C. to about 400° C. Then, in operation S350, another heat-treating process may be performed on the baked resultant at a temperature of about 400° C. to about 1,000° C.

When the temperatures of the heat-treating process and the baking process are within these ranges above, hardmasks with excellent etching resistance may be prepared. A temperature increasing rate in the heat-treating process and the baking process may be about 1° C./min to about 1000° C./min. When a temperature increasing rate is within this range, the deposited layer may not be damaged due to a rapid temperature change, and thus a process efficiency may be excellent.

Figure 4:
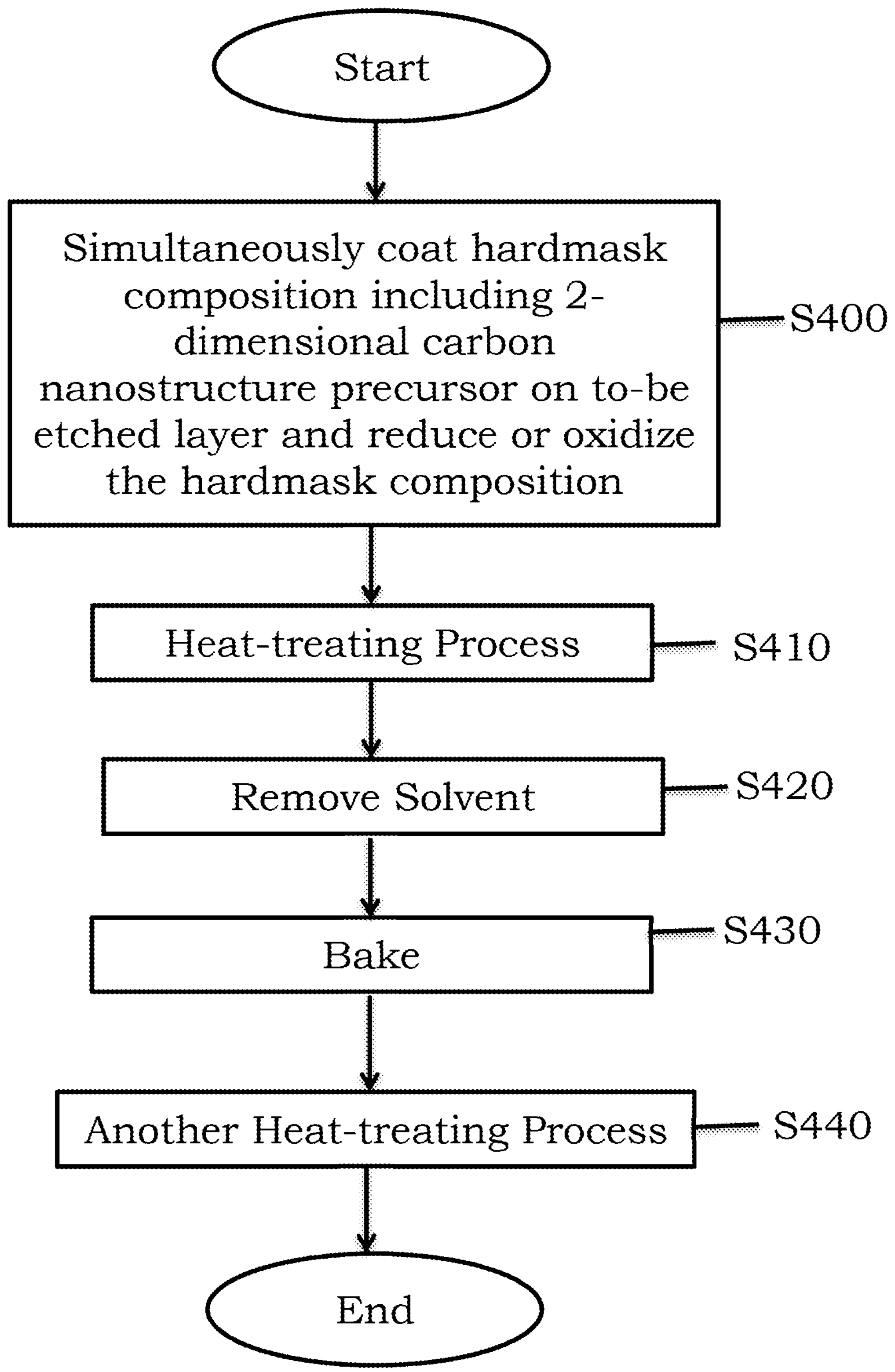
FIG. 4 illustrates a method of preparing a hardmask composition on a to-be-etched layer according to example embodiments.

FIG. 4 illustrates a method of preparing a hardmask composition on a to-be-etched layer according to example embodiments.

A hardmask according to example embodiments may be prepared by simultaneously coating the to-be-etched layer with the hardmask composition including the 2-dimensional carbon nanostructure precursor and a solvent and oxidizing or reducing the hardmask composition. The oxidizing or reducing the hardmask composition including the 2-dimensional carbon nanostructure precursor and solvent may be controlled until the hardmask including the 2-dimensional carbon nanostructure precursor is transformed to a hardmask including the 2-dimensional carbon nanostructure containing a desired oxygen content (e.g., about 0.01 atom % to about 40 atom % of oxygen).

In operation S410, a heat-treating process may be performed after coating the hardmask composition on the to-be-etched layer. Conditions for the heat-treating process may vary depending on a material of the to-be-etched layer, but a temperature of the heat-treating process may be from room temperature (in a range of about 20° C. to about 25° C.) to about 1500° C. The heat-treating process may be performed in an inert gas atmosphere and/or in vacuum. A heating source of the heat-treating process may be induction heating, radiant heat, lasers, infrared rays, microwaves, plasma, ultraviolet rays, or surface plasmon heating. The inert gas atmosphere may be prepared by mixing a nitrogen gas and/or an argon gas.

After the heat-treating process, in operation S420, the solvent may be removed. In operation S430, the resultant from which the solvent is removed may be baked at a temperature of about 100° C. to about 400° C. Then, in operation S440, another heat-treating process may be performed on the baked resultant at a temperature of about 400° C. to about 1,000° C.

When the temperatures of the heat-treating process and the baking process are within these ranges above, hardmasks with excellent etching resistance may be prepared. A temperature increasing rate in the heat-treating process and the baking process may be about 1° C./min to about 1000° C./min. When a temperature increasing rate is within this range, the deposited layer may not be damaged due to a rapid temperature change, and thus a process efficiency may be excellent.

As described above, when the 2-dimensional carbon nanostructure precursor is a 2-dimensional carbon nanostructure containing more than 40 atom % of oxygen, a hardmask may be prepared by i) coating the to-be-etched layer with the hardmask composition and then reducing the coated resultant, ii) reducing the hardmask composition and then coating the to-be-etched layer with the reduced hardmask composition, or iii) simultaneously coating the to-be-etched layer with hardmask composition and reducing the hardmask composition. The 2-dimensional carbon nanostructure containing more than 40 atom % of oxygen may contain, for example, about 60 atom % to about 80 atom % of oxygen.

As described above, when the 2-dimensional carbon nanostructure precursor contains less than 0.01 atom % of oxygen, a hardmask may be prepared by i) coating the to-be-etched layer with the hardmask composition and then oxidizing the coated resultant, ii) oxidizing the hardmask composition and then coating the to-be-etched layer with the oxidized hardmask composition, or iii) simultaneously coating the to-be-etched layer with the hardmask composition and oxidizing the hardmask composition.

The reducing process may be performed by chemical reduction, heat-treatment reduction, or electrochemical reduction.

The chemical reduction is performed by using a reducing agent. Also, the reduction caused by heat-treatment may be performed by heat-treatment at a temperature of about 100° C. to about 1500° C.

Non-limiting examples of the reducing agent may include at least one selected from the group consisting of ammonia-borane, hydrazine, sodium borohydride, dimethylhydrazine, sulfuric acid, hydrochloric acid, hydrogen iodide, hydrogen bromide, hydrogen sulfide, hydroquinone, hydrogen, and acetic acid.

When ammonia-borane is used as reducing agent, a hardmask composition, of which an oxygen content and $sp^2$ bond network are controlled may be prepared by i) coating the to-be-etched layer with the hardmask composition and then reducing the coated resultant, ii) reducing the hardmask composition and then coating the to-be-etched layer with the reduced hardmask composition, or iii) simultaneously coating the to-be-etched layer with the hardmask composition and reducing the hardmask composition.

Chemical reduction may be performed by removing a reducing agent from the reduced resultant after reducing a precursor of the 2-dimensional carbon nanostructure. The reducing agent is removed since degassing during an etching process may occur when residues such as sodium or potassium are remained in the reduced resultant.

However, when ammonia-borane is used as a reducing agent, ammonia-borane readily decomposes at a low temperature, and thus almost no residue remains in the reduced resultant without a process for removing the reducing agent. Therefore, removing the reducing agent is not needed.

In example embodiments, when ammonia-borane is used as a reducing agent, an amount of the residues such as sodium or potassium in the reduced resultant is 5 atom % or less, for example, about 0.000001 to about 5 atom %. Here, the amount of residues may be confirmed by XPS.

When ammonia-borane is used as a reducing agent, a hardmask may be prepared by reducing a hardmask composition including a 2-dimensional carbon nanostructure precursor and then coating a to-be-etched layer with the reduced resultant.

In example embodiments, when ammonia-borane is used as a reducing agent, a hardmask may be prepared by simultaneously coating a to-be-etched layer with a hardmask composition including a 2-dimensional carbon nanostructure precursor and reducing the hardmask composition.

An oxygen content and $sp^2$ bond network of the 2-dimensional carbon nanostructure precursor contained in the hardmask may be controlled by heat-treatment after the reducing of the hardmask composition during the process of preparing a hardmask. Here, performing the heat-treatment is optional.

A type of the heat-treatment may vary depending on a property of a substrate on which the hardmask in formed. For example, the heat-treatment may be performed at a temperature in a range of about 60° C. to about 400° C., for example, about 80° C. to about 400° C. When the heat-treatment is performed at a temperature within this range, a hardmask may have excellent etching resistance and mechanical strength and may be easily removed after an etching process without deterioration of efficiency of the process.

The oxidizing process may be performed by using at least one selected from acid, an oxidizing agent, UV, ozone, IR, heat-treatment, and plasma.

Examples of the acid may include sulfuric acid, nitric acid, acetic acid, phosphoric acid, hydrofluoric acid, perchloric acid, trifluoroacetic acid, hydrochloric acid, m-chlorobenzoic acid, and a mixture thereof. Also, examples of the oxidizing agent may include potassium permanganate, potassium perchlorate, ammonium persulfate, and a mixture thereof.

Hereinafter, a process of preparing a hardmask by using a 2-dimensional carbon nanostructure precursor according to example embodiments or a 2-dimensional carbon nanostructure obtained therefrom will be described in detail.

First, an interlayer insertion material may be intercalated into graphite to obtain exfoliated graphite; expanded graphite, which is a 2-dimensional carbon nanostructure precursor, may be obtained from the exfoliated graphite; and thus a composition including the 2-dimensional carbon nanostructure precursor may be obtained.

The expanded graphite may be obtained in the process of applying ultrasonic waves or microwaves to the exfoliated graphite or milling the exfoliated graphite. Here, the process of milling the exfoliated graphite may be performed by using a ball mill or a mono-planar mill.

Optionally, a liquid exfoliating process including dispersion in a solvent may be performed on the expanded graphite. When the liquid exfoliating process is performed on the expanded graphite, a 2-dimensional carbon nanostructure precursor including one layer to several tens layers of carbon layer (e.g., about 20 to about 70 layers of carbon layer) may be obtained.

The interlayer insertion material may be at least one selected from sulfuric acid, chromic acid, and ions such as potassium or sodium or an ion-containing compound.

Examples of the solvent in the liquid exfoliating process may be N-methylpyrrolidone, ethanol, and water. Also, ultrasonic waves may be used for the dispersion in the liquid exfoliating process. For example, the dispersion process in the solvent may be performed for about 0.5 hour to about 30 hours.

In example embodiments, when the expanded graphite is obtained by applying ultrasonic waves to the exfoliated graphite, a frequency of the ultrasonic waves may be in a range of about 20 KHz to about 60 KHz.

In example embodiments, when the expanded graphite is obtained by applying microwaves to the exfoliated graphite, an output of the microwaves may be about 50 W to about 1500 W, and a frequency of the microwaves may be in a range of about 2.45 KHz to about 60 KHz. A period of time for applying the microwaves may vary depending on the frequency of the microwaves but may be, for example, about 10 minutes to about 30 minutes.

Examples of graphite used as a starting material may include natural graphite, kish graphite, synthetic graphite, expandable graphite or expanded graphite, and a mixture thereof.

The hardmask composition thus obtained may be used to form a 2-dimensional carbon nanostructure layer, and then, according to a process of oxidizing the layer, a hardmask including a 2-dimensional carbon nanostructure having an oxygen content of about 0.01 atom % to about 40 atom % may be obtained. The 2-dimensional carbon nanostructure layer obtained in this manner may have no defect, and a hardmask including the 2-dimensional carbon nanostructure layer may have excellent etching resistance.

Second, the graphite may be acid-treated. For example, an acid or an oxidizing agent may be added to the graphite, heated to allow the reaction, and cooled to room temperature (about 20° C. to about 25° C.) to obtain a mixture containing a 2-dimensional carbon nanostructure precursor. An oxidizing agent is added to the precursor-containing mixture to perform an oxidizing process, and thus a 2-dimensional carbon nanostructure having about 0.01 atom % to about 40 atom % of oxygen may be obtained.

The 2-dimensional carbon nanostructure precursor may include less than about 0.01 atom % of oxygen or may not contain oxygen.

The oxidizing agent, a concentration of an acid solution, and a treating time in the oxidizing process may be adjusted to control the oxygen content.

Examples of the acid and the oxidizing agent are as described above. An amount of the oxidizing agent may be, for example, about 0.00001 part to about 30 parts by weight based on 100 parts by weight of the graphite.

Third, in the preparation process, the 2-dimensional carbon nanostructure precursor is oxidized to the maximum to obtain a composition containing a 2-dimensional carbon nanostructure precursor having more than 40 atom % of oxygen, and a 2-dimensional carbon nanostructure precursor layer is formed by using the composition. For example, an oxygen content in the 2-dimensional carbon nanostructure precursor may be about 80 atom % to about 90 atom %. The layer thus formed may be reduced, and thus a hardmask containing a 2-dimensional carbon nanostructure containing about 0.01 atom % to about 40 atom % of oxygen may be prepared.

The oxidizing process in the preparation process may be performed by using at least one selected from acid, an oxidizing agent, UV (ultraviolet), ozone, IR (infrared), heat-treatment, and plasma. Here, the acid and the oxidizing agent may be as described above.

Heat-treatment may be performed during or after the process of coating the to-be-etched layer with the hardmask composition. Here, a temperature of the heat-treatment differs depending on a purpose of the heat-treatment but may be, for example, in a range of about 100° C. to about 1500° C.

Hereinafter, a method of forming a pattern by using a hardmask composition according to example embodiments will be described by referring to FIGS. 5A to 5E.

Figure 5A:
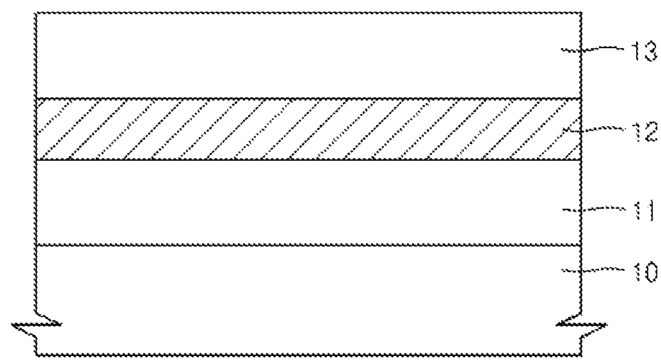
FIGS. 5A to 5E illustrate a method of forming a pattern by using a hardmask composition according to example embodiments.

Referring to FIG. 5A, a to-be-etched layer 11 may be formed on a substrate 10. A hardmask composition including a 2-dimensional carbon nanostructure that contains about 0.01 atom % to about 40 atom % of oxygen or a 2-dimensional carbon nanostructure precursor thereof and a solvent may be provided on the to-be-etched layer 11 to form a hardmask 12.

A process of providing the hardmask composition maybe performed by one method selected from spin coating, air spraying, electrospraying, dip coating, spray coating, doctor blade coating, and bar coating.

In example embodiments, the hardmask composition may be provided by using a spin-on coating method. Here, the hardmask composition may coat the substrate 10 at a thickness of, for example, in a range of about 10 nm to about 10,000 nm, or, about 10 nm to about 1,000 nm, but the thickness of the hardmask composition is not limited thereto.

A material of the substrate 10 is not particularly limited, and the substrate may be at least one selected from, for example, a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate. The substrate 10 may be semiconductor-on-insulator (SOI) substrate such as a silicon-on-insulator substrate.

A photoresist layer 13 may be formed on the hardmask 12.

Figure 5B:
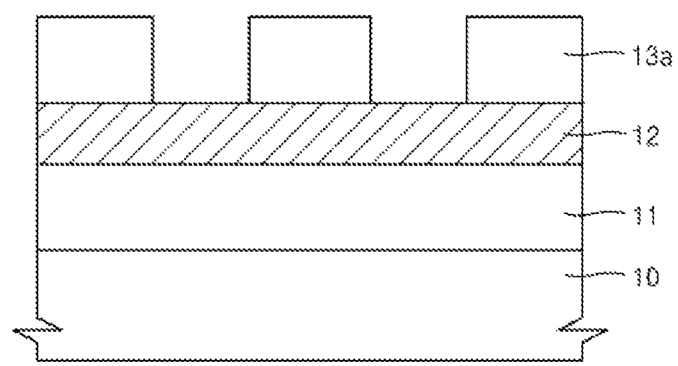

As shown in FIG. 5B, a photoresist pattern 13*a* may be formed by exposing and developing the photoresist layer 13 by using a common method in the art.

The process of exposing the photoresist layer 13 may be performed by using, for example, ArF, KrF, or EUV. Also, after the exposing process, a heat-treating process at a temperature in a range of about 200° C. to about 500° C. may be performed on the exposed photoresist layer 13.

In the developing process, a developing solution such as an aqueous solution of tetramethylammonium hydroxide (TMAH) may be used.

Figure 5C:
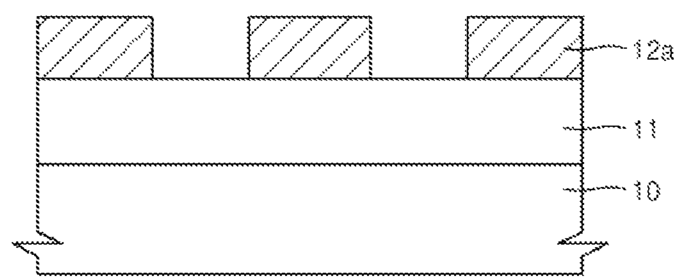

Thereafter, the hardmask 12 may be etched by using the photoresist pattern 13*a* as an etching mask to form a hardmask pattern 12*a* on the to-be-etched layer 11 (FIG. 5C).

A thickness of the hardmask pattern 12*a* may be in a range of about 10 nm to about 10,000 nm. When the thickness of the hardmask pattern 12*a* is within this range, the hardmask pattern 12*a* may have excellent etching resistance as well as excellent homogenousness.

For example, the etching process may be performed by using a dry etching method using an etching gas. Examples of the etching gas include a fluorine-containing and/or a chlorine-containing gas. For example, the etching gas may include at least one of $CF_4$, $C_2F_6$, $C_4F_8$, $CHF_3$, $Cl_2$, and $BCl_3$, but example embodiments are not limited thereto In example embodiments, when a mixture gas of $C_4F_8$ and $CHF_3$ is used as the etching gas, a mixing ratio of $C_4F_8$ and $CHF_3$ may be in a range of about 1:10 to about 10:1 at a volume ratio.

The to-be-etched layer 11 may be formed as a plurality of patterns. The plurality of patterns may vary, for example, may be a metal pattern, a semiconductor pattern, and an insulator pattern. For example, the plurality of patterns may be various patterns applied to a semiconductor integrated circuit device.

The to-be-etched layer 11 may contain a material that is to be finally patterned. The material of the to-be-etched layer 11 may be, for example, a metal such as aluminum or copper, a semiconductor such as silicon, or an insulator such as silicon oxide or silicon nitride. The to-be-etched layer 11 may be formed by using various methods such as sputtering, electronic beam deposition, chemical vapor deposition, and physical vapor deposition. For example, the to-be-etched layer 11 may be formed by using a chemical vapor deposition method.

Figure 5D:
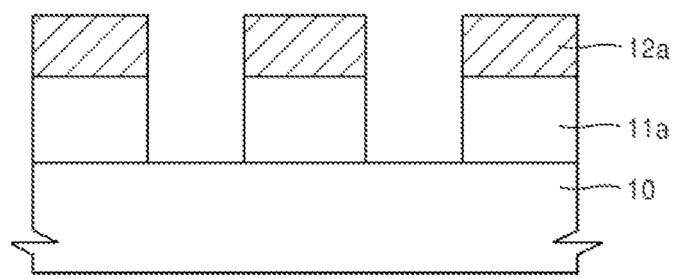
Figure 5E:
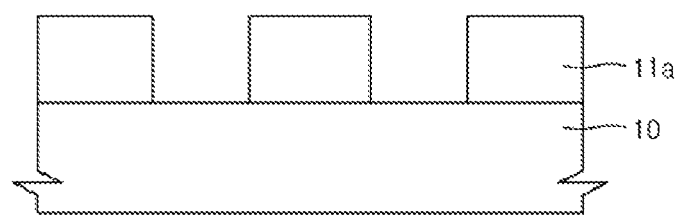

As shown in FIGS. 5D to 5E, the to-be-etched layer 11 may be etched by using the hardmask pattern 12*a* as an etching mask to later form a to-be-etched layer pattern 11*a* having a desired fine pattern.

In example embodiments, the hardmask may be used as a stopper in the manufacture of a semiconductor device by being inserted between other layers.

Figure 5F:
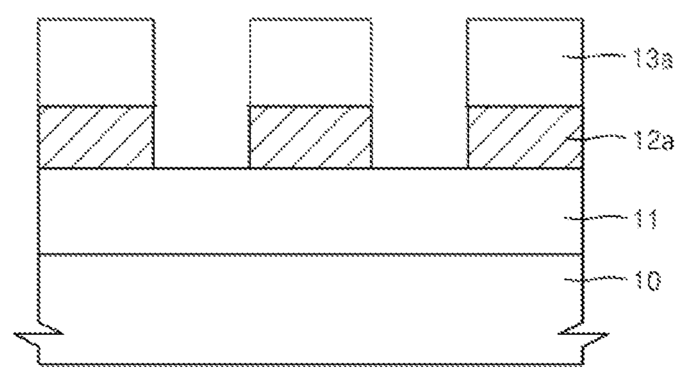
FIG. 5F illustrates a part of method of forming a pattern by using a hardmask composition according to example embodiments.

FIG. 5F illustrates a part of method of forming a pattern by using a hardmask composition according to example embodiments.

Referring to FIG. 5F, as previously-described with reference to FIG. 5A, a to-be-etched layer 11 may be formed on a substrate 10 and a hardmask 12 may be formed on the to-be-etched layer 11. Then, as previously-described with reference to FIG. 5B, a photoresist pattern 13*a* may be formed on the hardmask 12. Thereafter, the hardmask 12 may be etched using the photoresist pattern 13*a* as an etching mask to form a hardmask pattern 12*a* on the to-be etched layer 11. As shown in FIG. 5F, a portion of the photoresist pattern 13*a* may remain after the hardmask pattern 12*a* is formed.

Then, the to-be-etched layer 11 may be etched to form an etched layer pattern 11*a* having a desired fine pattern using a remaining portion of the photoresist pattern 13*a* and the hardmask pattern 12*a* as an etching mask. Afterwards, the hardmask pattern 12*a* and any residual portion of photoresist pattern 13*a* may be removed using $O_2$ ashing and/or wet stripping to form a structure including the etched layer pattern 11*a* on the substrate 10 (see FIG. 5E). For example, the wet stripping may be performed by using alcohol, acetone, or a mixture of nitric acid and sulfuric acid.

Hereinafter, a method of forming a pattern by using a hardmask composition according to example embodiments, will be described by referring to FIGS. 6A to 6D.

Figure 6A:
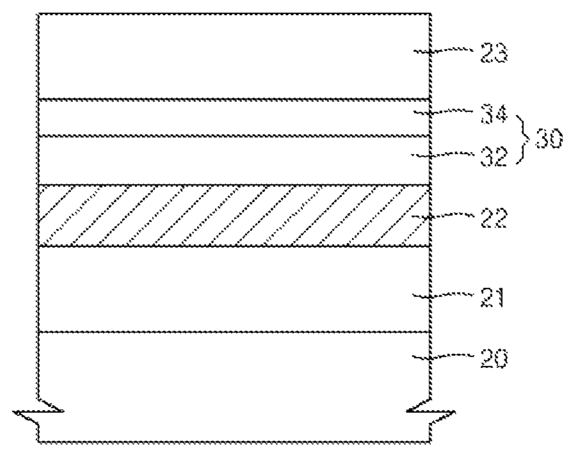
FIGS. 6A to 6D illustrate a method of forming a pattern by using a hardmask composition according to example embodiments.

Referring to FIG. 6A, a to-be-etched layer 21 is formed on a substrate 20. The substrate 20 may be a silicon substrate, but is not limited to and may be any of the materials previously described as suitable for the substrate 10 in FIG. 5A.

The to-be-etched layer 21 may be formed as, for example, a silicon oxide layer, a silicon nitride layer, a silicon nitroxide layer, a silicon oxynitride (SiON) layer, a silicon carbide (SiC) layer, or a derivative layer thereof.

Thereafter, a hardmask composition may be provided on the to-be-etched layer 21 to form a hardmask 22. In other words, a hardmask composition including a 2-dimensional carbon nanostructure that contains about 0.01 atom % to about 40 atom % of oxygen or a 2-dimensional carbon nanostructure precursor thereof and a solvent may be provided on the to-be-etched layer 21 to form a hardmask 22.

Figure 6B:
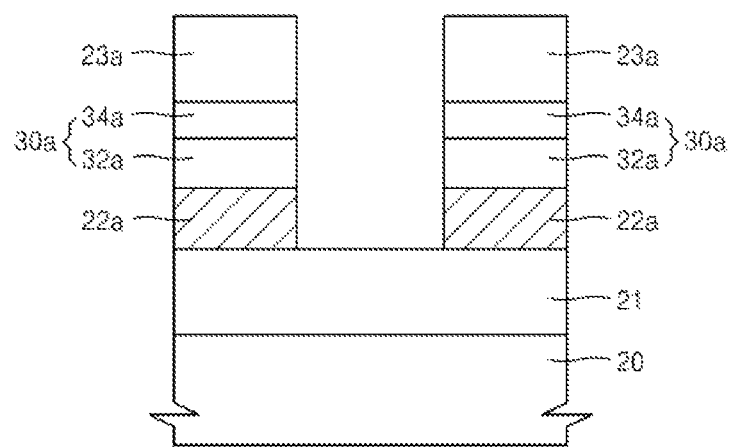
Figure 6C:
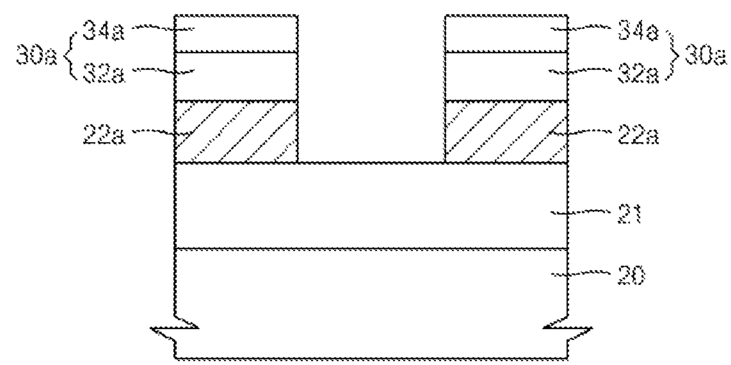

An anti-reflection layer 30 may be formed on the hardmask 22. Here, the anti-reflection layer 30 may include an inorganic anti-reflection layer, an organic anti-reflection layer, or a combination thereof. FIGS. 6A to 6C illustrate cases where the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a high absorption coefficient on a photoresist with respect to a wavelength of light.

A thickness of the anti-reflection layer 30 may be, for example, in a range of about 100 nm to about 500 nm.

A photoresist layer 23 is formed on the anti-reflection layer 30.

The photoresist layer 23 is exposed and developed in a common manner to form a photoresist pattern 23*a*. Then, the anti-reflection layer 30 and the hardmask 22 are sequentially etched by using the photoresist pattern 23*a* as an etching mask to form a hardmask pattern 22*a* on the to-be-etched layer 21. The hardmask pattern 22*a* includes an inorganic anti-reflection layer pattern 32*a* and an organic anti-reflection layer pattern 34*a*.

FIG. 6B illustrates that the photoresist pattern 23*a* and an anti-reflection layer pattern 30*a* remain after forming the hardmask pattern 22*a*. However, in some cases, part of or the whole photoresist pattern 23*a* and the anti-reflection layer pattern 30*a* may be removed after the etching process for forming the hardmask pattern 22*a*.

FIG. 6C illustrates that only the photoresist pattern 23*a* may be removed.

Figure 6D:
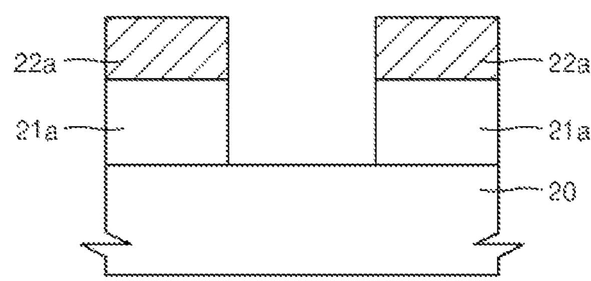

The to-be-etched layer 21 may be etched by using the hardmask pattern 22*a* as an etching mask to form a desired layer pattern, which is a to-be-etched layer pattern 21*a* (FIG. 6D).

As described above, the hardmask pattern 22*a* is removed after forming the to-be-etched layer pattern 21. In the preparation of the hardmask pattern according to example embodiments, the hardmask pattern 22*a* may be easily removed by using a common method in the art, and almost no residue remains after removing the hardmask pattern 22*a*.

The removing process of the hardmask pattern 22*a* may be performed by, but not limited to, $O_2$ ashing and wet stripping. For example, the wet stripping may be performed by using alcohol, acetone, or a mixture of nitric acid and sulfuric acid.

A 2-dimensional carbon nanostructure of a hardmask prepared in the manner described above is a structure having 2-dimensional nanocrystalline carbon layers stacked in a direction of a z-axis. Also, the 2-dimensional carbon nanostructure may have a thickness of about 100 nm or less, a length of about 500 nm to about 50 μm. Also, an aspect ratio (a ratio of the longest diameter to the shortest diameter) of the 2-dimensional carbon nanostructure may be at least 50.

The hardmask includes a 2-dimensional carbon nanostructure containing about 0.01 atom % to about 40 atom % of oxygen, and the amount of $sp^2$ carbon structures is higher than the amount of $sp^3$ carbon structures in the hardmask. Thus, the hardmask may secure sufficient resistance to dry etching.

FIGS. 7A to 7D illustrate a method of forming a pattern by using a hardmask composition according to example embodiments.

Figure 7A:
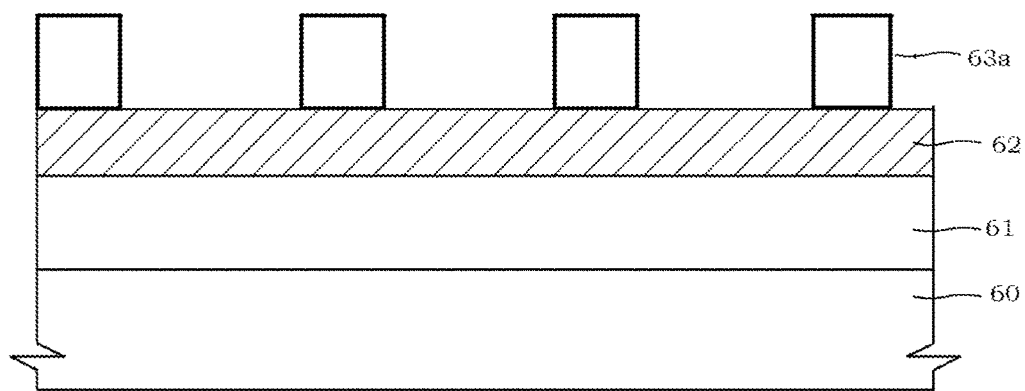
FIGS. 7A to 7D illustrate a method of forming a pattern by using a hardmask composition according to example embodiments.

Referring to FIG. 7A, a to-be-etched layer 61 may be formed on a substrate 60. Then, a hardmask 62 may be formed on the to-be-etched layer 61 and a first photoresist pattern 63*a* may be formed on the hardmask 62.

A material of the substrate 60 is not particularly limited, and the substrate may be at least one selected from, for example, a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate. The substrate 60 may be semiconductor-on-insulator (SOI) substrate such as a silicon-on-insulator substrate.

The to-be-etched layer 61 may be formed as, for example, a silicon oxide layer, a silicon nitride layer, a silicon nitroxide layer, a silicon oxynitride (SiON) layer, a silicon carbide (SiC) layer, or a derivative layer thereof. However, example embodiments are not limited thereto.

Thereafter, a hardmask composition may be provided on the to-be-etched layer 61 to form a hardmask 62. In other words, a hardmask composition including a 2-dimensional carbon nanostructure that contains about 0.01 atom % to about 40 atom % of oxygen or a 2-dimensional carbon nanostructure precursor thereof and a solvent may be provided on the to-be-etched layer 61 to form a hardmask 62.

Figure 7B:
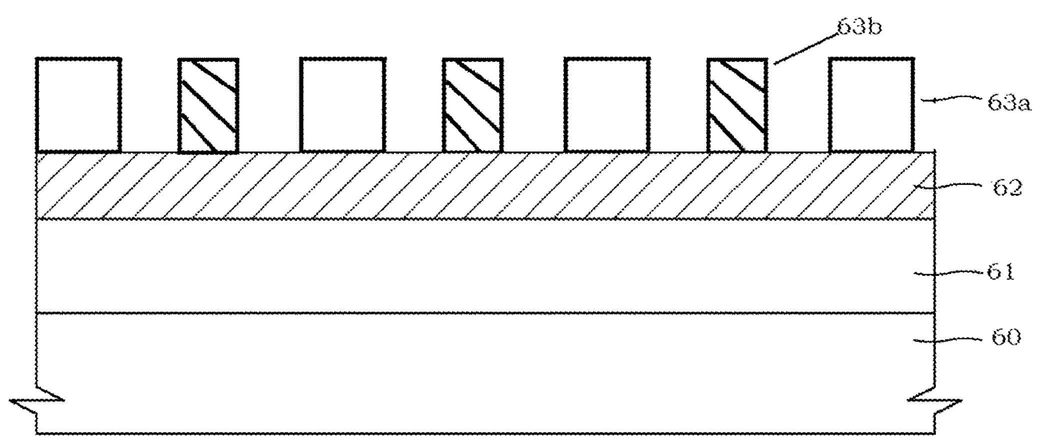

Thereafter, as shown in FIG. 7B, a second photoresist pattern 63*b* may be formed on top of the hardmask 62. The first and second photoresist patterns 63*a* and 63*b* may be alternately arranged.

Figure 7C:
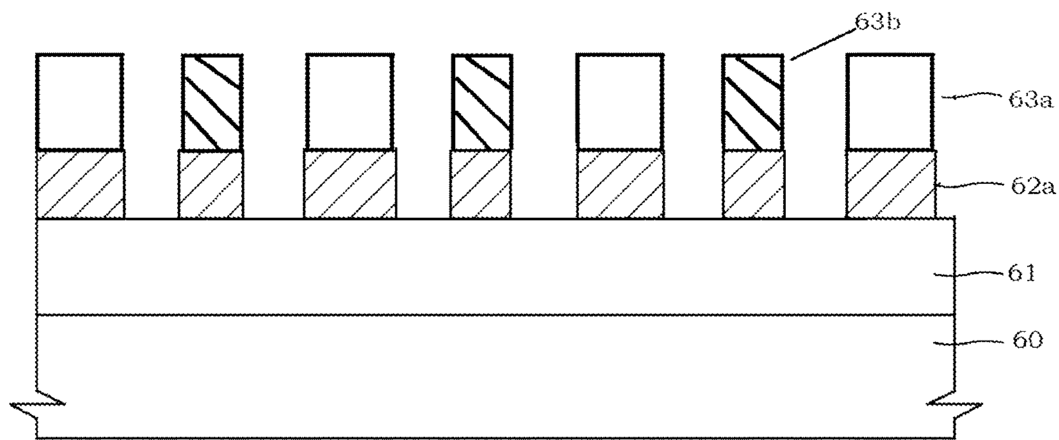

In FIG. 7C, the hardmask layer 62 may be etched using the photoresist patterns 63*a* and 63*b* as an etch mask to form a hardmask pattern 62*a*. Then, in FIG. 7D, the to-be etched layer 61 may be etched to form a to-be-etched layer pattern 61*a*.

Figure 7D:
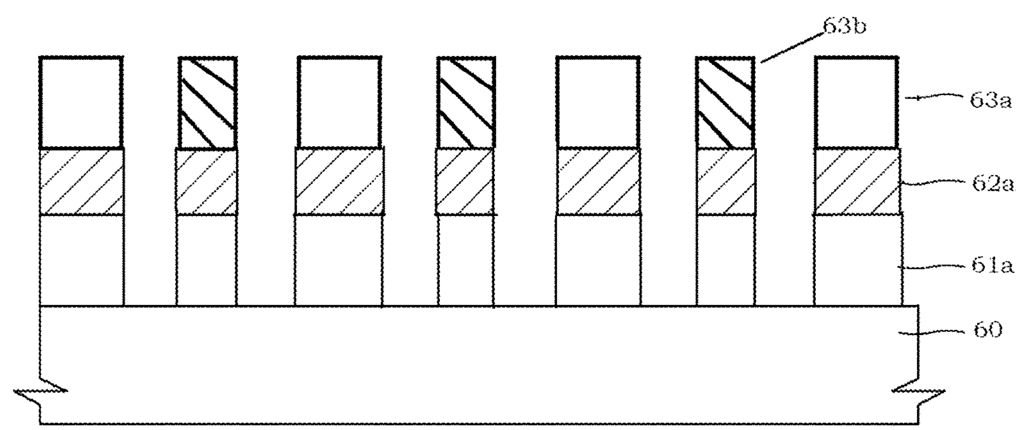

Even though FIGS. 7C and 7D illustrate the first and second photoresist patterns 63*a* and 63*b* remain on top of the hardmask pattern 62*a* after forming the hardmask pattern 62*a*, example embodiments are not limited thereto. A portion and/or an entire portion of the first and second photoresist patterns 63*a* and 63*b* may be removed during (and/or after) the process of forming the hardmask pattern 62*a* and/or the to-be-etched layer 61*a* in FIGS. 7C and 7D.

FIGS. 8A to 8D illustrate a method of forming a pattern by using a hardmask composition according to example embodiments.

Figure 8A:
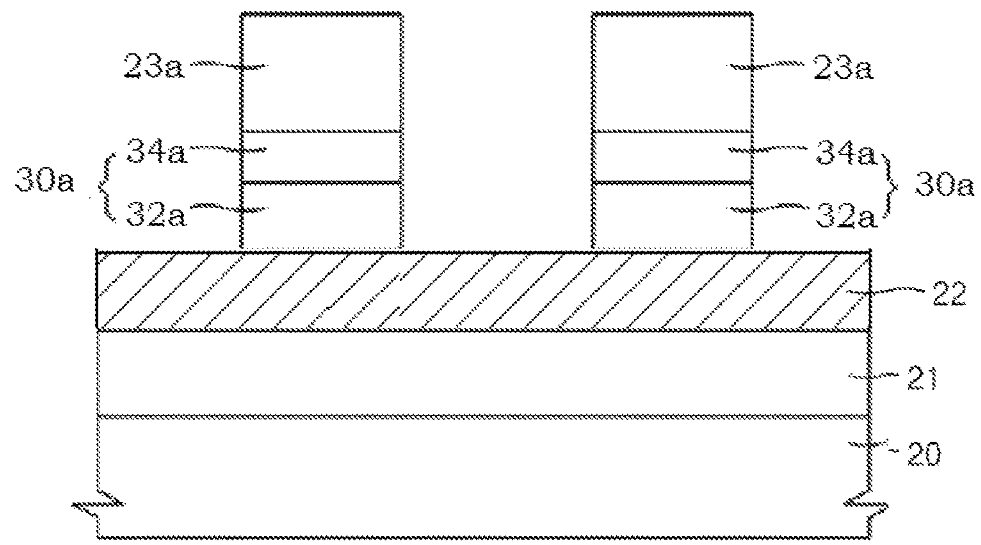
FIGS. 8A to 8D illustrate a method of forming a pattern by using a hardmask composition according to example embodiments.

Referring to FIG. 8A, as previously described with reference to FIG. 6A, a stacked structure including the substrate 20, to-be-etched layer 21, hardmask layer 22, anti-reflection layer 30, and photoresist layer 23 may be formed.

Thereafter, the photoresist layer may be exposed and developed in a common manner to form a photoresist pattern 23*a*. The anti-reflection layer 30 may be etched by using the photoresist pattern 23*a* as an etching mask to form an anti-reflection layer pattern 30*a* on the to-be-etched layer 21. The anti-reflection layer pattern 30*a* may include an inorganic anti-reflection layer pattern 32*a* and an organic anti-reflection layer pattern 34*a*.

Figure 8B:
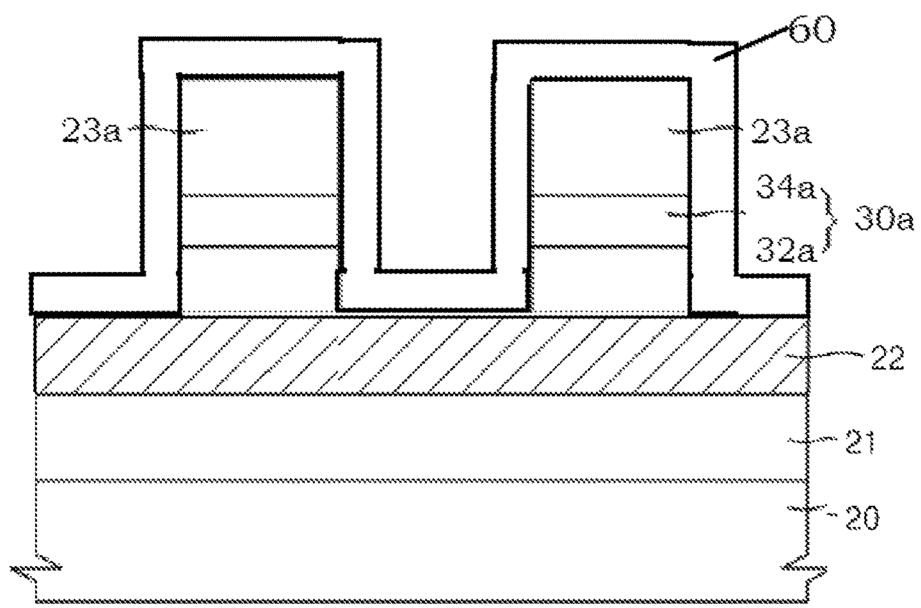

As shown in FIG. 8B, a dielectric layer 60 (e.g., silicon oxide) may be coated on the photoresist pattern 23*a*.

Figure 8C:
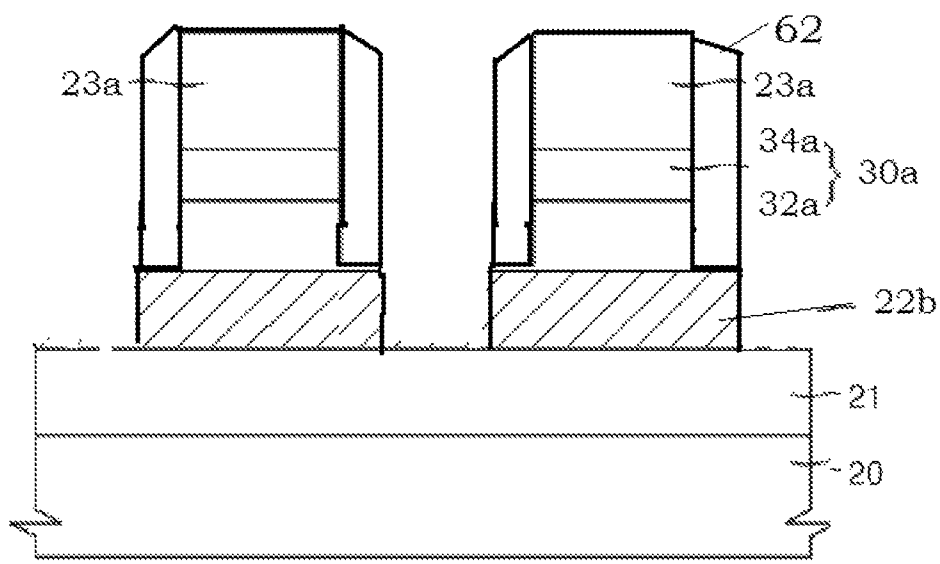

Referring to FIG. 8C, spacers 62 may be formed by etching the dielectric layer 60. A hardmask pattern 22*b* may be formed by etching the hard mask layer 22 using the photoresist pattern 23*a* and spacers 62 as an etch mask.

Figure 8D:
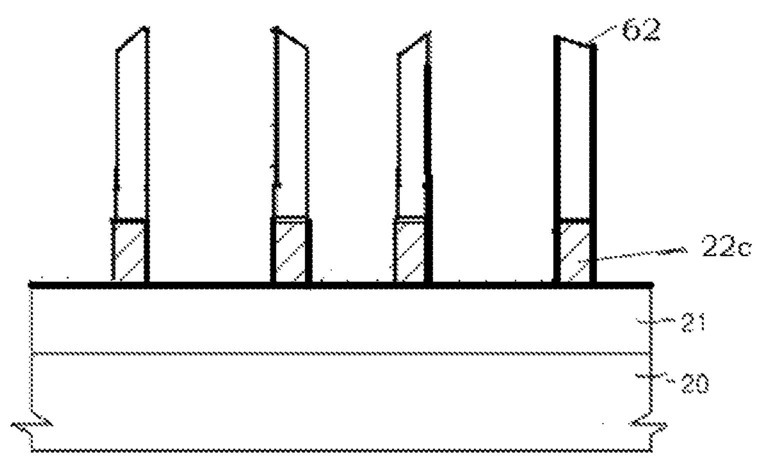

Referring to FIG. 8D, the photoresist pattern 23*a* and anti-reflection layer pattern 30*a* may be removed using the spacers 62 as an etch mask. Next, a second hardmask pattern 22*c* may be formed by etching the hardmask pattern 22*b* using the spacers as an etch mask.

Thereafter, the to-be-etched layer 21 may be etched to form a pattern corresponding to the second hardmask pattern 22*c* using the spacers 62 and the second hardmask pattern 22*c* as an etch mask. Additionally, the spacers 62 and second hardmask pattern 22*c* may be subsequently removed after patterning the to-be-etched layer 21.

According to example embodiments, a pattern formed by using a hardmask composition may be used in the manufacture and design of an integrated circuit device according to a preparation process of a semiconductor device. For example, the pattern may be used in the formation of a patterned material layer structure such as metal lining, holes for contact or bias, insulation sections (example: a Damascene Trench (DT) or shallow trench isolation (STI)), or a trench for a capacitor structure.

The present disclosure will be described in further detail with reference to the following examples. These examples are for illustrative purposes only and are not intended to limit the scope of example embodiments.

Example 1

10 g of graphite powder was added to 50 ml of sulfuric acid ($H_2SO_4$) and stirred for about 4 hours to about 5 hours at a temperature of about 80° C. The stirred mixture was diluted with 1 L of deionized water and stirred for about 12 hours. The resultant was filtered to obtain pre-treated graphite.

Phosphorus pentoxide ($P_2O_5$) was dissolved in 80 ml of water, 480 ml of sulfuric acid was added, 4 g of the pre-treated graphite was added, and then 24 g of potassium permanganate ($KMnO_4$) was added thereto. After stirring the mixture, about 1 hour of sonication was performed thereon and 600 ml of water ($H_2O$) was added thereto. When 15 ml of hydrogen peroxide ($H_2O_2$) was added to the obtained reaction mixture, the color of the reaction mixture turned from purple to light yellow and sonication was performed thereon while stirring the mixture. The reaction mixture was filtered to remove residual graphite that is not oxidized. In order to remove manganese (Mn) from the filtered solution obtained after the filtration, 200 ml of hydrochloric acid, 200 ml of ethanol, and 200 ml of water were added to the filtered solution, and the mixture was stirred. The stirred mixture was centrifuged to obtain a 2-dimensional carbon nanostructure precursor. Here, a content of the oxygen in the 2-dimensional carbon nanostructure precursor was 30 atom %.

0.5 g of the 2-dimensional carbon nanostructure precursor thus obtained was dispersed in 1 L of water to obtain a hardmask composition. Heat-treatment was performed at a temperature of about 200° C. while spray coating the hardmask composition on a silicon oxide layer formed on a silicon substrate. Subsequently, the resultant was baked at a temperature of about 400° C. for about 1 hour and then vacuum heat-treated at a temperature of about 600° C. for about 1 hour to form a hardmask containing a 2-dimensional carbon nanostructure and having a thickness of about 200 nm.

The hardmask was coated with an ArF photoresist at a thickness of about 1700 Å and then pre-baked at a temperature of about 110° C. for about 60 seconds. The resultant was then exposed to light by using a light exposing instrument available from ASML (XT: 1400, NA 0.93) and post-baked at a temperature of about 110° C. for about 60 seconds. Next, the photoresist was developed by using an aqueous solution of 2.38 wt % TMAH (tetramethyl ammonium hydroxide) to form a photoresist pattern.

Dry etching was performed using the photoresist pattern, as a mask, and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

$O_2$ ashing and wet stripping were performed on a hardmask and an organic material remaining after performing the dry etching to obtain a desired silicon substrate having a silicon oxide layer pattern as a final pattern.

Example 2

A silicon substrate having a silicon oxide layer pattern was prepared in the same manner as in Example 1, except that a vacuum heat-treatment temperature was 850° C.

Example 3

A silicon substrate having a silicon oxide layer pattern was prepared in the same manner as in Example 1, except that a vacuum heat-treatment temperature was 400° C.

Example 4

A silicon substrate having a silicon oxide layer pattern was prepared in the same manner as in Example 1, except that a vacuum heat-treatment temperature was 900° C.

Example 5

A silicon substrate having a silicon oxide layer pattern was prepared in the same manner as in Example 1, except that the process of preparing the 2-dimensional carbon nanostructure precursor was controlled to obtain a hardmask including a 2-dimensional carbon nanostructure containing about 0.01 atom % of oxygen.

Example 6

A silicon substrate having a silicon oxide layer pattern was prepared in the same manner as in Example 1, except that the process of preparing the 2-dimensional carbon nanostructure precursor was controlled to obtain a hardmask including a 2-dimensional carbon nanostructure containing about 40 atom % of oxygen.

Example 7

A silicon substrate, on which a silicon oxide is formed, was primary spray coated with ½ of the hardmask composition prepared in Example 1 while performing heat-treatment at a temperature of about 200° C. Here, a content of the oxygen in the 2-dimensional carbon nanostructure precursor was 30 atom %.

Subsequently, the resultant was baked at a temperature of about 400° C. for about 1 hour, and then primary vacuum heat-treatment was performed thereon at a temperature of about 400° C. for about 1 hour.

Next, the vacuum heat-treated resultant was spray-coated with the other ½ of the hardmask composition prepared in Example 1 while performing heat-treatment at a temperature of about 200° C. Subsequently, the resultant was baked at a temperature of about 400° C. for about 1 hour, and then secondary vacuum heat-treatment was performed thereon at a temperature of about 400° C. for about 1 hour to form a hardmask containing a 2-dimensional carbon nanostructure and having a thickness of about 200 nm.

Example 8

0.5 g of the 2-dimensional carbon nanostructure precursor prepared in Example 1 was dispersed in 1 L of water, and 0.5 g of ammonia-borane was added thereto and then the resultant was reduced at a temperature of about 80° C. to prepare a hardmask composition. The hardmask composition was vapor-deposited on the silicon substrate, on which a silicon oxide is formed, at a temperature of about 200° C. to form a hardmask containing a 2-dimensional carbon nanostructure and having a thickness of about 200 nm. An amount of oxygen in the 2-dimensional carbon nanostructure was about 16 atom %.

Comparative Example 1

A silicon substrate having a silicon oxide layer pattern was prepared by using a hardmask including high-temperature amorphous carbon.

A carbon source ($C_3H_6$) was vapor-deposited on the silicon oxide layer formed on the silicon substrate to form a hardmask including high-temperature amorphous carbon.

The vapor deposition was performed by using a chemical vapor deposition method under conditions including a temperature of about 550° C., a pressure of about 0.05 mTorr, and an ion energy of about 250 eV.

The hardmask was coated with an ArF photoresist at a thickness of about 1700 Å and then pre-baked at a temperature of about 110° C. for about 60 seconds. The resultant was then exposed to light by using a light exposing instrument available from ASML (XT: 1400, NA 0.93) and post-baked at a temperature of about 110° C. for about 60 seconds. Next, the photoresist was developed by using an aqueous solution of 2.38 wt % TMAH to form a photoresist pattern.

Dry etching was performed using the photoresist pattern, as a mask, and a $CF_4/CHF_3$ mixture gas. The etching conditions included 20 mT of a chamber pressure, 1800 W of a RT power, a 4/10 volume ratio of $C_4F_8/CHF_3$, and an etching time of about 120 seconds.

$O_2$ ashing and wet stripping were performed on the hardmask and an organic material remaining after performing the dry etching to obtain a desired silicon substrate having a silicon oxide layer pattern as a final pattern.

Comparative Example 2

A silicon substrate having a silicon oxide layer pattern was prepared by using a hardmask including low-temperature amorphous carbon in the same manner as in Comparative Example 1, except that a temperature of a deposition condition for the carbon source ($C_3H_6$) was changed to 300° C. to obtain low-temperature amorphous carbon.

Comparative Example 3

A monomer represented by Formula 1 below was dissolved in a mixture solvent including propylene glycol monomethyl ether acetate (PGMEA), N-methylpyrrolidone, and gamma-butyrolactone (at a volume ratio of 40:20:40), and the solution was filtered to prepare a hardmask composition:

[Formula 1]

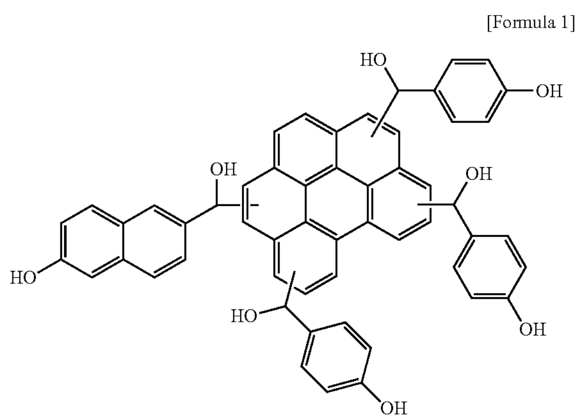

A silicon substrate having a silicon oxide layer pattern was coated with the hardmask composition obtained in the manner described above by using a spin-on coating method, and then the resultant was heat-treated at a temperature of about 400° C. for about 120 seconds to form a hardmask including spin-on-carbon (SOC).

The hardmask was coated with an ArF photoresist at a thickness of about 1700 Å and then pre-baked at a temperature of about 110° C. for about 60 seconds. The resultant was then exposed to light by using a light exposing instrument available from ASML (XT: 1400, NA 0.93) and post-baked at a temperature of about 110° C. for about 60 seconds. Next, the photoresist was developed by using an aqueous solution of 2.38 wt % TMAH to form a photoresist pattern.

Dry etching was performed using the photoresist pattern as a mask and a $CF_4/CHF_3$ mixture gas. The etching conditions included 20 mT of a chamber pressure, 1800 W of a RF power, a 4/10 volume ratio of $C_4F_8/CHF_3$, and an etching time of about 120 seconds.

$O_2$ ashing and wet stripping were performed on the hardmask and an organic material remaining after performing the dry etching to obtain a desired silicon substrate having a silicon oxide layer pattern as a final pattern.

Comparative Example 4

A silicon substrate having a silicon oxide layer pattern was prepared in the same manner as in Example 1, except that the process of preparing the 2-dimensional carbon nanostructure precursor was controlled to obtain a hardmask including a 2-dimensional carbon nanostructure containing about 0.005 atom % of oxygen.

Evaluation Example 1: X-Ray Diffraction (XRD) Analysis Measurement

XRD analysis was performed on the 2-dimensional carbon nanostructures prepared in Examples 1 to 3 and the high-temperature amorphous carbon prepared in Comparative Example 1. For the XRD analysis, a 12 KW XRD diffractometer available from BRUKER AXS was used, and the analysis conditions included measurement at a rate of about 4° per minute within a range of about 5° to about 80° as a diffraction angle 2θ.

Figure 9:
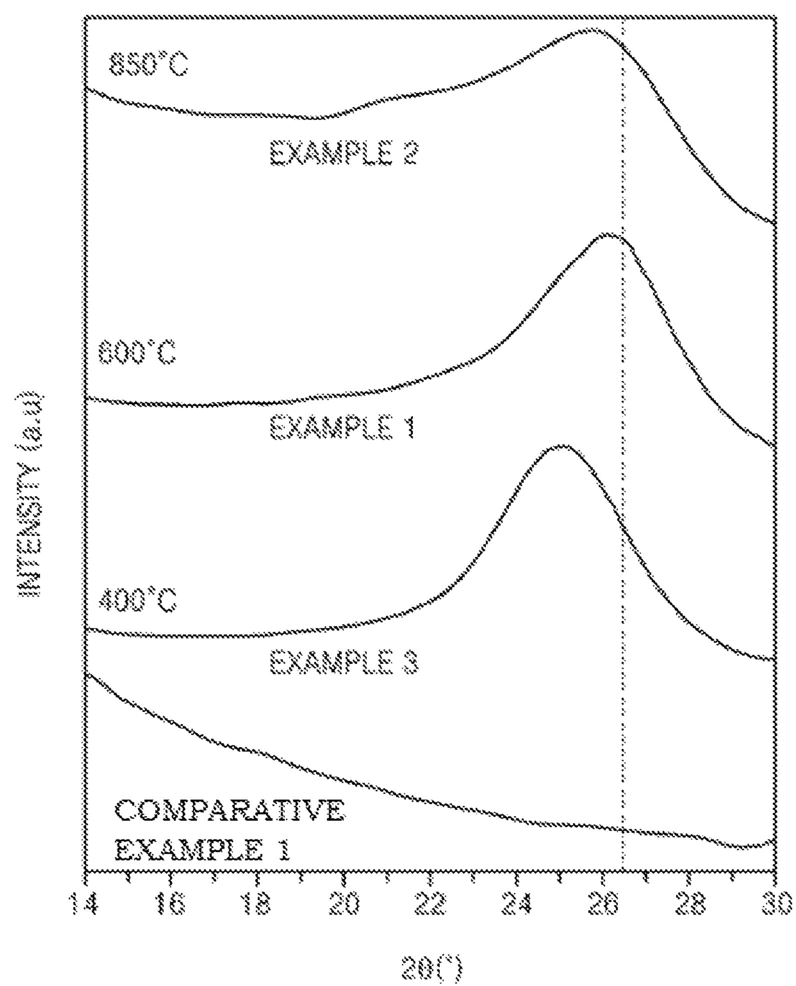
FIG. 9 is X-ray diffraction analysis results of 2-dimensional carbon nanostructures prepared in Examples 1 to 3 and an amorphous carbon prepared in Comparative Example 1.

The analysis results are shown in FIG. 9.

Referring to FIG. 9, it may be confirmed that the diffraction angle 2θ of (002) crystal face peaks of the 2-dimensional carbon nanostructures prepared in Examples 1 to 3 were observed within a range of about 25° to about 27°, unlike that of the amorphous carbon prepared in Comparative Example 1. From the results of the XRD analysis of the 2-dimensional carbon nanostructures prepared in Examples 1 to 3, d-spacings ($d_{002}$) and average particle diameters (La) of the crystals were obtained and are shown in Table 1.

The d-spacings were calculated by using Bragg's law defined in Equation 1 below, and the average particle diameters of the crystals were calculated by using the Scherrer equation defined in Equation 2.

$$d_{002}=\lambda/2 \sin \theta \quad \text{[Equation 1]}$$

$$D=(0.9\lambda)/(\beta \cos \theta) \quad \text{[Equation 2]}$$

In Equations 1 and 2, λ is an X-ray wavelength (1.54 Å) and β is a full width at half maximum (FWHM) at a Bragg's angle.

TABLE 1

| | d-spacing (nm) | Average particle diameter (La) of crystals (Å) |
|---|---|---|
| Example 1 | 0.356 | 28.0 |
| Example 2 | 0.343 | 25.1 |
| Example 3 | 0.334 | 24.5 |

Evaluation Example 2: Raman Spectrum Analysis

Figure 10:
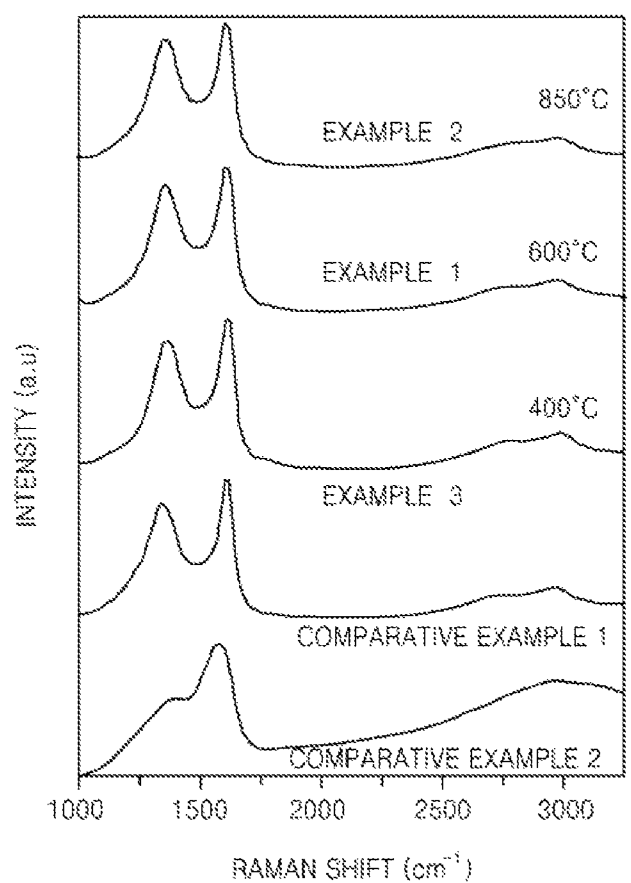
FIG. 10 is Raman spectroscopy analysis results of the 2-dimensional carbon nanostructures prepared in Examples 1 to 3, high-temperature amorphous carbon prepared in Comparative Example 1, and low-temperature amorphous carbon prepared in Comparative Example 2.

Raman spectroscopy analysis was performed on the 2-dimensional carbon nanostructures prepared in Examples 1 to 3 and the high-temperature amorphous carbon prepared in Comparative Example 1. The Raman spectroscopy analysis results are shown in FIG. 10. The Raman spectroscopy analysis was performed by using the Raman instrument, RM-1000 Invia (514 nm, $Ar^+$ ion laser), available from Renishaw. Here, a D peak, a G peak, and a 2D peak respectively are peaks at about 1340 $cm^{-1}$ to about 1350 $cm^{-1}$, at about 1580 $cm^{-1}$, and at about 2700 $cm^{-1}$.

Referring to FIG. 10, an intensity ratio of a D mode peak to a G mode peak ($I_D/I_G$) and an intensity ratio of a 2D mode peak to a G mode peak ($I_{2D}/I_G$) of the 2-dimensional carbon nanostructures prepared in Examples 1 to 3, the high-temperature amorphous carbon prepared in Comparative Example 1, and the low-temperature amorphous carbon prepared in Comparative Example 2 were obtained and are shown in Table 2.

TABLE 2

| | $I_D/I_G$ | $I_{2D}/I_G$ |
|---|---|---|
| Example 1 | 0.87 | 0.01 |
| Example 2 | 0.86 | 0.02 |
| Example 3 | 0.90 | 0.1 |
| Comparative Example 1 | 0.85 | — |

Table 2 shows the hardmask composition prepared in Examples 1-3 have a different structure than the hardmask composition in Comparative Example 1.

Evaluation Example 3: XPS Analysis

XPS spectroscopy analysis was performed on the 2-dimensional carbon nanostructures prepared in Examples 1 to 4 and the high-temperature amorphous carbon prepared in Comparative Example 1 by using a Quantum 2000 (Physical Electronics).

The analysis results are shown in Table 3. In theory, Comparative Example 1 should have no oxygen; however, one of ordinary skill in the art would appreciate that the inclusion of moisture and/or oxygen by pollution and impurities during the XPS analysis may account for the oxygen content corresponding to Comparative Example 1 in Table 3.

TABLE 3

| | XPS | | |
|---|---|---|---|
| | C/O atomic ratio | Oxygen content (atom %) | C═C/C—C[a] |
| Example 1 | 6.7 | 12.7 | 1.98 |
| Example 2 | 14.4 | 6.43 | 2.29 |
| Example 3 | 6.9 | 12.5 | 2.1 |
| Example 4 | 23.8 | 3.99 | 4.2 |

[a]C═C/C—C denotes an intensity ratio of a peak intensity corresponding to a C═C bond and a peak intensity corresponding to a C—C bond, which also shows a ratio of a fraction of $sp^2$ to a fraction of $sp^3$.

Evaluation Example 4: Etching Resistance

Etching resistance was evaluated by calculating an etching selection ratio by measuring the thickness differences of the hardmask and the silicon oxide layer before and after performing the dry etching by using each of the hardmasks prepared in Examples 2, 3, 7, and 8.

In Table 4, the etching selection ratio shows a ratio of the thickness difference of the silicon oxide before and after the etching to the thickness difference of the hard mask before and after the etching.

TABLE 4

| | Etching selection ratio |
|---|---|
| Example 2 | 12.2 |
| Example 3 | 16.0 |
| Example 7 | 14.0 |
| Example 8 | 12.7 |
| Comparative Example 1 | 10.0 |
| Comparative Example 2 | 7.0 |
| Comparative Example 3 | 5.35 |

As shown in Table 4, the etching selection ratios of the hardmasks prepared in Examples 2, 3, 7, and 8 increased, and thus the etching resistances of the hardmasks prepared in the Examples 2, 3, 7, and 8 were improved than those of the hardmasks prepared in Comparative Examples 1 to 3.

Evaluation Example 5: Pattern Shape Analysis

Etching was performed by using each of the hardmasks prepared in Examples 1 to 8 and Comparative Examples 1 to 3, and then a cross-section of the silicon substrate having a silicon oxide layer pattern was observed by using FE-SEM, and the results are shown in Table 5.

TABLE 5

| | Shape of pattern after hardmask etching | Shape of pattern after silicon oxide etching |
|---|---|---|
| Example 1 | Vertical | Vertical |
| Example 2 | Vertical | Vertical |
| Example 3 | Vertical | Vertical |
| Example 4 | Vertical | Vertical |
| Example 5 | Vertical | Vertical |
| Example 6 | Vertical | Vertical |
| Example 7 | Vertical | Vertical |
| Example 8 | Vertical | Vertical |
| Comparative Example 1 | Arched | Tapered |
| Comparative Example 2 | Arched | Tapered |
| Comparative Example 3 | Arched | Tapered |

As shown in Table 5, the silicon oxide layer pattern shapes having each of the hardmasks prepared in Examples 1 to 8 are vertical, unlike that of the hardmask prepared in Comparative Examples 1-3.

As described above, hardmasks according to example embodiments may have excellent etching resistance and mechanical strength compared to that of conventional polymers or amorphous carbon and may be easily removed after an etching process, and accordingly, the efficiency of a semiconductor process may be improved by using the hardmask.

It should be understood that example embodiments described herein should be considered in a descriptive sense only and not for purposes of limitation. Descriptions of features or aspects within each hardmask composition, method of making a fine pattern, and/or method of making a hardmask composition respectively should typically be considered as available for other similar features or aspects in other hardmask compositions, methods of making a fine pattern, and/or methods of making a hardmask composition according to example embodiments. While some example embodiments have been particularly shown and described, it will be understood by those of ordinary skill in the art that various changes in form and details may be made therein without departing from the spirit and scope of the claims.

What is claimed is:

1. A hardmask composition comprising:
a 2-dimensional carbon nanostructure containing about 0.01 atom % to about 40 atom % of oxygen, an intensity ratio of a D mode peak to a G mode peak obtained by Raman spectroscopy of the 2-dimensional carbon nanostructure being 2 or lower; and
a solvent, wherein
a fraction of $sp^2$ carbon is equal to or a multiple of a fraction of $sp^3$ carbon in the 2-dimensional carbon nanostructure.

2. The hardmask composition of claim 1, wherein the intensity ratio of the D mode peak to the G mode peak obtained by Raman spectroscopy of the 2-dimensional carbon nanostructure is in a range of 0.001 to about 2.0.

3. The hardmask composition of claim 1, wherein a diffraction angle 2θ of a (002) crystal face peak obtained by X-ray diffraction analysis of the 2-dimensional carbon nanostructure is observed within a range of about 20° to about 27°.

4. The hardmask composition of claim 1, wherein a d-spacing of the 2-dimensional carbon nanostructure obtained by X-ray diffraction analysis is about 0.3 to about 0.5 nm.

5. The hardmask composition of claim 1, wherein the 2-dimensional carbon nanostructure has crystallinity in a C-axis, and an average particle diameter of crystals is about 1 nm or greater.

6. The hardmask composition of claim 5, wherein the average particle diameter of crystals is in a range of about 23.7 Å to about 43.9 Å.

7. A method of forming a pattern, the method comprising:

forming a to-be-etched layer on a substrate;

forming a hardmask on the to-be-etched layer by supplying the hardmask composition of claim 1, the hardmask including the 2-dimensional carbon nanostructure;

forming a photoresist pattern on the hardmask;

forming a hardmask pattern on the to-be-etched layer by etching the 2-dimensional carbon nanostructure by using the photoresist pattern as an etching mask, the hardmask pattern including the 2-dimensional carbon nanostructure; and etching the to-be-etched layer by using the hardmask pattern as an etching mask.

8. The method of claim 7, wherein the forming the hardmask on the to-be-etched layer includes coating the hardmask composition on the to-be-etched layer.

9. The method of claim 8, further comprising:

heat-treating the hardmask composition, wherein the heat-treating is performed during or after the coating the hardmask composition on the to-be-etched layer.

10. The method of claim 7, wherein the 2-dimensional carbon nanostructure of the hardmask pattern is a structure formed by stacking 2-dimensional nanocrystalline carbon layers.

11. The method of claim 7, wherein a thickness of the hardmask is about 10 nm to about 10,000 nm.

12. The method of claim 7, wherein the step of forming the hardmask on the to-be-etched layer is performed using at least one of spin coating, air spray, electrospray, dip coating, spray coating, a doctor blade method, and bar coating.

13. The method of claim 7, wherein the to-be-etched layer includes one of a metal, a semiconductor, and an insulator.

14. The hardmask composition of claim 1, wherein the solvent includes at least one of water, methanol, isopropanol, ethanol, N,N-dimethylformamide, N-methylpyrrolidone, dichloroethane, dichlorobenzene, N,N-dimethylsulfoxide, xylene, aniline, propylene glycol, propylene glycol diacetate, methoxy propanediol, diethylene glycol, acetyl acetone, cyclohexanone, propylene glycol monomethyl ether acetate, γ-butyrolactone, O-dichlorobenzene, nitromethane, tetrahydrofuran, dimethyl sulfoxide, nitrobenzene, butyl nitrite, methyl cellosolve, ethyl cellosolve, diethyl ether, diethylene glycol methyl ether, diethylene glycol ethyl ether, dipropylene glycol methyl ether, toluene, hexane, methyl ethyl ketone, methyl isobutyl ketone, hydroxymethyl cellulose, and heptane.

15. A hardmask composition comprising:

a 2-dimensional carbon nanostructure containing about 0.01 atom % to about 40 atom % of oxygen, an intensity ratio of a 2D mode peak to a G mode peak obtained by Raman spectroscopy of the 2-dimensional carbon nanostructure being 0.01 or higher; and a solvent, wherein a fraction of $sp^2$ carbon is equal to or a multiple of a fraction of $sp^3$ carbon in the 2-dimensional carbon nanostructure.

16. The hardmask composition of claim 15, wherein the intensity ratio of the 2D mode peak to the G mode peak obtained by Raman spectroscopy of the 2-dimensional carbon nanostructure is in a range of about 0.01 to about 1.0.

17. The hardmask composition of claim 15, wherein the solvent includes at least one of water, methanol, isopropanol, ethanol, N,N-dimethylformamide, N-methylpyrrolidone, dichloroethane, dichlorobenzene, N,N-dimethylsulfoxide, xylene, aniline, propylene glycol, propylene glycol diacetate, methoxy propanediol, diethylene glycol, acetyl acetone, cyclohexanone, propylene glycol monomethyl ether acetate, γ-butyrolactone, O-dichlorobenzene, nitromethane, tetrahydrofuran, dimethyl sulfoxide, nitrobenzene, butyl nitrite, methyl cellosolve, ethyl cellosolve, diethyl ether, diethylene glycol methyl ether, diethylene glycol ethyl ether, dipropylene glycol methyl ether, toluene, hexane, methyl ethyl ketone, methyl isobutyl ketone, hydroxymethyl cellulose, and heptane.

18. A method of forming a pattern, the method comprising:

forming a to-be-etched layer on a substrate;

forming a hardmask on the to-be-etched layer by supplying the hardmask composition of claim 16, the hardmask including the 2-dimensional carbon nanostructure;

forming a photoresist pattern on the hardmask;

forming a hardmask pattern on the to-be-etched layer by etching the 2-dimensional carbon nanostructure by using the photoresist pattern as an etching mask, the hardmask pattern including the 2-dimensional carbon nanostructure; and etching the to-be-etched layer by using the hardmask pattern as an etching mask.

19. The method of claim 18, wherein the to-be-etched layer includes one of a metal, a semiconductor, and an insulator.

* * * * *